(12) United States Patent
Kim

(10) Patent No.: US 10,761,124 B2
(45) Date of Patent: *Sep. 1, 2020

(54) ELECTRONIC DEVICES AND METHODS FOR DETECTING FOREIGN OBJECT ON CONNECTOR

(71) Applicant: Samsung Electronics Co., Ltd., Suwon-si, Gyeonggi-do (KR)

(72) Inventor: Je-kook Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/781,357

(22) Filed: Feb. 4, 2020

(65) Prior Publication Data

US 2020/0174049 A1 Jun. 4, 2020

Related U.S. Application Data

(63) Continuation of application No. 16/053,155, filed on Aug. 2, 2018, now Pat. No. 10,564,199.

(30) Foreign Application Priority Data

Sep. 11, 2017 (KR) .................. 10-2017-0115908

(51) Int. Cl.
*G01R 27/26* (2006.01)
*G01R 31/68* (2020.01)
*G08B 21/18* (2006.01)
*G01V 3/02* (2006.01)
(Continued)

(52) U.S. Cl.
CPC ............. *G01R 27/26* (2013.01); *G01R 31/68* (2020.01); *G01V 3/02* (2013.01); *G08B 21/18* (2013.01); *H01R 13/665* (2013.01); *H01R 24/60* (2013.01)

(58) Field of Classification Search
None
See application file for complete search history.

(56) References Cited

U.S. PATENT DOCUMENTS 9,157,880 B2 10/2015 Stevens et al.
9,274,992 B2 3/2016 Altmann et al.
9,448,611 B2 9/2016 Yao
(Continued)

FOREIGN PATENT DOCUMENTS

JP 3329481 B2 9/2002

OTHER PUBLICATIONS

Non-Final Office Action dated May 30, 2019 in U.S. Appl. No. 16/053,155.
(Continued)

*Primary Examiner* — Thomas S McCormack
(74) *Attorney, Agent, or Firm* — Harness, Dickey & Pierce, P.L.C.

(57) ABSTRACT

An electronic device including a connector having a plurality of pins, and a detection circuit having at least one of a pull-up circuit and a pull-down circuit, and a connection circuit between a first pin and a second pin of the plurality of pins, the detection circuit is configured to select the first pin and the second pin, measure an impedance between the selected first pin and second pin by controlling a connection of the connection circuit and the at least one of the pull-up circuit and the pull-down circuit, and generate a detection signal indicating a presence or an absence of a foreign object on the connector based on the measured impedance.

20 Claims, 26 Drawing Sheets

(51) Int. Cl.
*H01R 24/60* (2011.01)
*H01R 13/66* (2006.01)

(56) References Cited

U.S. PATENT DOCUMENTS

| | | |
|---|---|---|
| 2014/0313039 A1 | 10/2014 | Stevens et al. |
| 2016/0026551 A1 | 1/2016 | Kim et al. |
| 2016/0157033 A1 | 6/2016 | Won et al. |
| 2016/0308452 A1 | 10/2016 | Motoki |
| 2016/0313270 A1 | 10/2016 | Connell et al. |
| 2016/0350251 A1 | 12/2016 | Lee |
| 2016/0364360 A1 | 12/2016 | Lim |
| 2017/0110835 A1 | 4/2017 | Hasegawa et al. |
| 2017/0127203 A1 | 5/2017 | Ryu |
| 2017/0133792 A1 | 5/2017 | Werley et al. |

OTHER PUBLICATIONS

Notice of Allowance dated Sep. 17, 2019 in U.S. Appl. No. 16/053,155.

ELECTRONIC DEVICES AND METHODS FOR DETECTING FOREIGN OBJECT ON CONNECTOR

CROSS-REFERENCE TO RELATED APPLICATIONS

This application is a Continuation of U.S. application Ser. No. 16/053,155, filed on Aug. 2, 2018, which claims the benefit of Korean Patent Application No. 10-2017-0115908, filed on Sep. 11, 2017, in the Korean Intellectual Property Office, the disclosure of each of which is incorporated herein in its entirety by reference.

BACKGROUND

Some example embodiments relate to electronic devices, and more particularly, to electronic devices and methods for detecting a foreign object on a connector.

An electronic device may include a connector and may communicate with an external electronic device via a cable inserted in the connector. When foreign objects are introduced into the connector, some pins on the connector may be short-circuited, corroded or broken. Also, when the electronic device is charged through the cable, electric current may flow between some of the pins on the connector, resulting in excessive power consumption by the electronic device, which may cause damage to the electronic device.

SUMMARY

According to some example embodiments, there is provided an electronic device including a plurality of pins and a detection circuit. The detection circuit including at least one of a pull-up circuit and a pull-down circuit, and a connection circuit between a first pin and a second pin of the plurality of pins. The detection circuit is configured to select the first pin and the second pin. The detection circuit is further configured to measure an impedance between the selected first pin and second pin by controlling a connection of connection circuit and the at least one of the pull-up circuit and the pull-down circuit. Furthermore, the detection circuit is configured to generate a detection signal indicating a presence or an absence of a foreign object on the connector based on the measured impedance.

According to some example embodiments, there is provided an electronic device including a connector having a plurality of pins and a power delivery integrated circuit (PDIC). The PDIC is configured to generate a detection signal indicating presence or absence of a foreign object on the connector. The PDIC includes a selection circuit configured to select a first pin and a second pin among the plurality of pins. The PDIC further includes a pull-up circuit configured to provide a power supply voltage to a first node connected to the first pin and a second node connected to the second pin. The PDIC further includes a pull-down circuit configured to provide a ground voltage to the first node and the second node; a connection circuit including a resistor between the first node and the second node. Furthermore, the PDIC includes a controller configured to generate a detection signal based on a first voltage signal of the first node and a second voltage signal of the second node.

According to some example embodiments, there is provided a foreign object detecting method performed by an electronic device including a controller. The method includes selecting first and second pins among a plurality of pins included in a connector. The method further includes measuring an impedance between the selected first and second pins using the controller. The method further includes generating a detection signal indicating presence or absence of a foreign object on the connector based on the measured impedance. Furthermore, the method includes providing a foreign object alarm message according to the generated detection signal.

BRIEF DESCRIPTION OF THE DRAWINGS

The drawings attached hereto may not accord to a scale and may illustrate exaggerated or reduced components, for convenience of illustration.

DETAILED DESCRIPTION

Hereinafter, some example embodiments will be described in detail with reference to the accompanying drawings.

Figure 1:
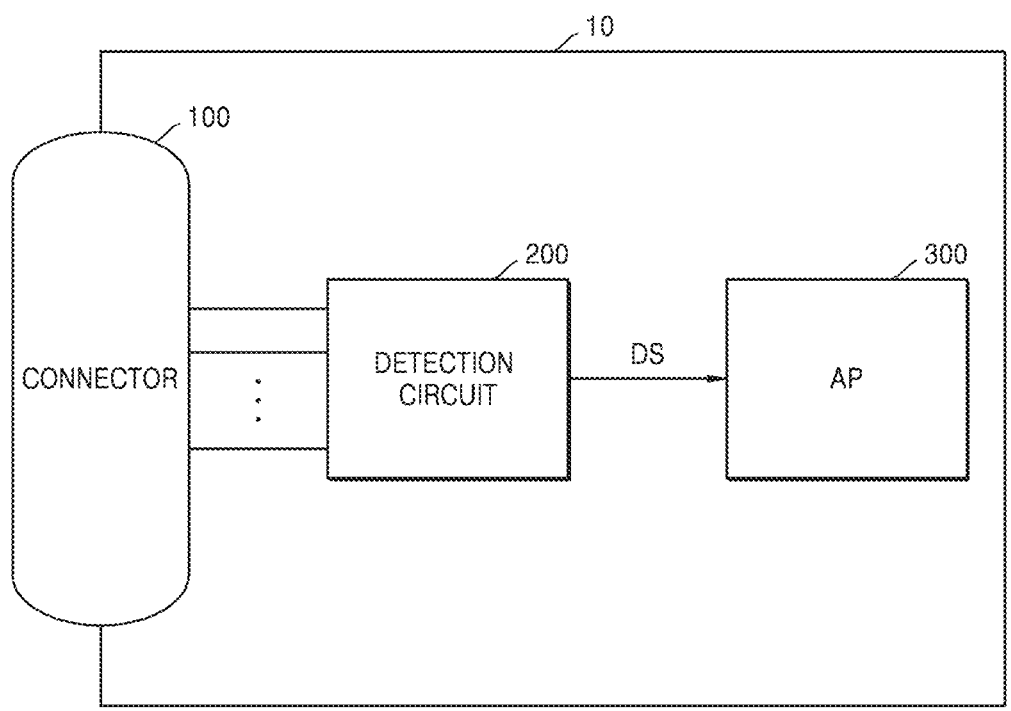
FIG. 1 is a block diagram schematically illustrating an electronic device according to some example embodiments.

FIG. 1 is a block diagram schematically illustrating an electronic device 10 according to some example embodiments.

Referring to FIG. 1, the electronic device 10 may include a connector 100 and a detection circuit 200. In some example embodiments, the electronic device 10 may be a USB device capable of communicating with an external electronic device via a USB interface. However, the electronic device 10 is not limited to a USB device, and may be any electronic device capable of communicating with the external electronic device via an interface according to another communication standard. Furthermore, the electronic device 10 may be any electronic device including an audio jack terminal such as an ear jack terminal.

The connector 100 may be a receptacle or a plug. In some example embodiments, the connector 100 may be connected to an external cable and may perform communication between the external device and the electronic device 10 via the cable. The detection circuit 200 may be electrically connected to the connector 100 to detect a presence or absence of foreign objects on the connector 100. Accordingly, the detection circuit 200 may be referred to as a 'foreign object detection circuit'. The electronic device 10 may further include an application processor (AP) 300 that controls the overall operation of the electronic device 10. According to some example embodiments, operations described herein as being performed by the application processor 300 may be performed by at least one processor executing program code that includes instructions corresponding to the operations. The instructions may be stored in a memory. The term 'processor,' as used in the present disclosure, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a microprocessor, a central processing unit (CPU), a processor core, a multi-core processor, a multiprocessor, an application-specific integrated circuit (ASIC), and a field programmable gate array (FPGA).

The connector 100 may include a plurality of pins configured to be coupled to an external cable. A signal may be transmitted or received, or electric power may be transmitted, through the plurality of pins. Since the plurality of pins are physical terminals having electrical conductivity and the plurality of pins are spaced apart from each other by a determined distance, adjacent pins may be insulated from each other in a normal state in which no foreign object is introduced into the connector 100. In some example embodiments, the cable may be a USB Type-C cable and the connector 100 may be a USB Type-C receptacle. USB Type C is a physical specification of a terminal or a socket for a USB device or a cable and defines the standards for new receptacles, plugs, and cables that are compatible with existing USB interfaces. Hereinafter, the USB type-C receptacle will be described in detail as an example of the connector 100 with reference to FIG. 2. However, some example embodiments are not limited thereto, and the connector 100 may be a USB type-C plug.

Figure 2:
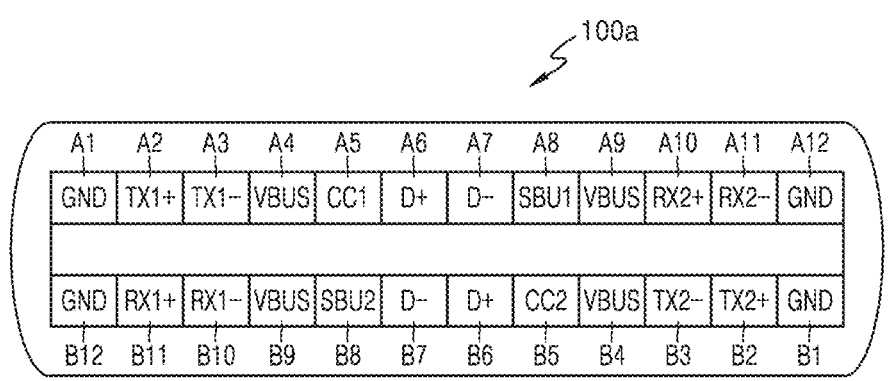
FIG. 2 shows an example of a connector according to some example embodiments.

FIG. 2 shows an example of a connector 100a according to some example embodiments.

Referring to FIG. 2, the connector 100a may be a USB type-C receptacle and may include pins A1 to A12 of a first row and pins B1 to B12 of a second row. The pins A1 to A12 of the first row and the pins B1 to B12 of the second row may have a symmetrical structure by which the connector 100a and a USB type-C cable may be normally connected regardless of directions of the connector 100a and the USB type-C cable. Various terms to be described below may be understood by those skilled in the art through a USB type-C standard document, and thus a detailed description thereof will be omitted.

The connector 100a may support data communication of various speeds. As an example, the connector 100a may include TX and RX pins A2, A3, A10, A11, B2, B3, B10, and B11 that support high speed data communication according to a first standard (e.g., USB 3.1) and D pins A6, A7, B6, and B7 that support low speed data communication according to a second standard (e.g., USB 2.0). Also, each of the pins A1 to A12 of the first row and the pins B1 to B12 of the second row may perform a unique function. For example, VBUS pins A4, A9, B4, and B9 may correspond to pins that supply a power voltage, GND pins A1, A12, B1 and B12 may correspond to pins that transmit a ground voltage and SBU pins A8 and B8 may correspond to sideband use pins.

On the other hand, an electronic device (for example, 10 in FIG. 1) including the connector 100a may perform bidirectional communication. For example, the electronic device 10 may operate as a host device (e.g., a downstream facing port (DFP)) or as a slave device (e.g., an upstream facing port (UFP) when connected to an external device via a USB interface. Alternatively, the electronic device 10 may operate as a dual role port (DRP), where the electronic device 10 may adaptively change between a role of the host device (e.g., DFP) and a role of the slave device (e.g., UFP). The role of the electronic device may be specified via CC (Configuration Channel) pins A5 and B5. As an example, in the case of a USB interface, data connection and control may be performed by digital communication via a CC1 pin A5 and a CC2 pin B5.

According to a model of the electronic device, only some of the plurality of pins A1 to A12 and B1 to B12 on the connector 100a may be used. As an example, some models may not use one or more of the multiple GND pins A1, A12, B1, and B12. As another example, some models may not use at least one of the pins A2, A3, A10, A11, B2, B3, B10, and B11 associated with high speed data communication. A pin not used in the electronic device may not be electrically connected to an integrated circuit in the electronic device associated with communication and may be opened.

As described above, since the connector 100a includes a larger number of the pins A1 to A12 and B1 to B12 than conventional ones, an internal structure may be dense and an influence of foreign objects, for example, a possibility of a short between adjacent pins, may be high, which may damage the electronic device. Accordingly, a method of detecting whether foreign objects are present on the connector 100a and providing a foreign object alarm message to a user according to a result of the detection would be desirable. Hereinafter, some example embodiments in which the connector 100a is a USB type-C connector will be described. However, some example embodiments may be equally or similarly applied to connectors of other structures.

Referring again to FIG. 1, the detection circuit 200 may select first and second pins of the plurality of pins included in the connector 100, and measure impedance between the selected first and second pins, that is, pin-to-pin impedance. Further, the detection circuit 200 may generate a detection signal DS indicating whether foreign objects are present on the connector 100 based on the measured pin-to-pin impedance. In some example embodiments, the detection circuit 200 may generate the foreign object alarm message when foreign objects are present on the connector 100 or limit voltage or current supplied to the VBUS pins A4, A9, B4, and B9 of the plurality of pins. Specific configuration and operation of the detection circuit 200 will be described in more detail with reference to FIGS. 3 and 4.

The AP 300 may receive the detection signal DS from the detection circuit 200 and generate the foreign object alarm message based on the received detection signal DS or limit voltage or current supplied to the VBUS pins A4, A9, B4, and B9 of the plurality of pins. In some example embodiments, the AP 300 may limit the voltage or the current supplied to the VBUS pins A4, A9, B4, and B9 by controlling a Power Management Integrated Circuit (PMIC) (e.g., 700 in FIG. 18) or an Interface (IF)-PMIC (e.g., 500 in FIG. 18). In some example embodiments, the AP 300 may be implemented as a System-On-Chip (SoC).

An electronic device according to some example embodiments may include at least one of, for example, a smartphone, a tablet personal computer, a mobile phone, a video phone, an e-book reader, a desktop personal computer (PC), a laptop personal computer (PC), a netbook computer, a workstation, a server, a personal digital assistant (PDA), a portable multimedia player (PMP), an MP3 player, a mobile medical device, a camera, and a wearable device. According to some example embodiments, the wearable device may include at least one of an accessory type (e.g., a watch, a ring, a bracelet, a bracelet, a necklace, a spectacle, a contact lens or a head-mounted-device (HMD)), a texture or clothing integration type (e.g., electronic apparel), a body attachment type (e.g., skin pads or tattoos), and bioimplantable (e.g., implantable circuits).

Figure 3:
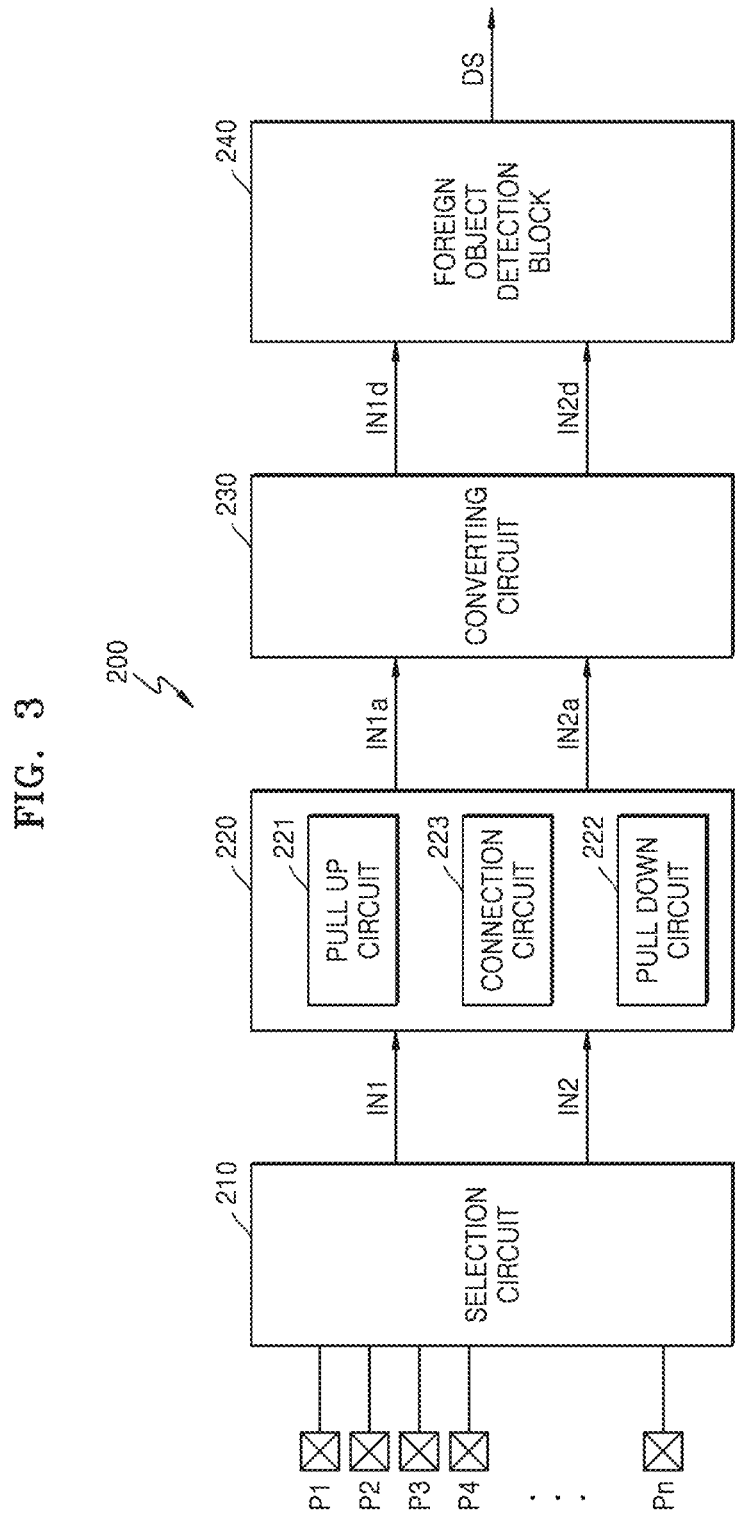
FIG. 3 is a detailed block diagram of a detection circuit of FIG. 1, according to some example embodiments.

FIG. 3 is a detailed block diagram of the detection circuit 200 of FIG. 1, according to some example embodiments. Referring to FIG. 3, the detection circuit 200 may include a selection circuit 210, a voltage signal generation circuit 220, a converting circuit 230, and a foreign object detection block 240. In some example embodiments, the detection circuit 200 may be implemented as part of a Power Delivery IC (PDIC).

The selection circuit 210 may be connected to a plurality of pins P1 to Pn and may select first and second ones of the plurality of pins P1 to Pn. Here, n is an integer of 2 or more, and may be variously changed according to some example embodiments. In some example embodiments, n may be 24, and the selection circuit 210 may be connected to the plurality of pins A1 through A12 and B1 through B12 of FIG. 2. In some example embodiments, n may be 8, and the selection circuit 210 may be connected to some of the plurality of pins A1 through A12 and B1 through B12 of FIG. 2. For example, the pins A1, A4 through A8, and B5 and B8 in FIG. 2 may be connected to the selection circuit 210, but some example embodiments are not limited thereto. Also, the selection circuit 210 may output a first input IN1 and a second input IN2 from the selected first and second pins. However, some example embodiments are not limited thereto, and in some example embodiments, the selection circuit 210 may be implemented to select three or more pins.

The voltage signal generation circuit 220 may receive the first and second inputs IN1 and IN2 from the selection circuit 210 and generate first and second voltage signals IN1a and IN2a respectively corresponding to the first and second inputs IN1 and IN2. The first voltage signal IN1a may have a voltage level according to a state of the first pin. The second voltage signal IN2a may have a voltage level according to a state of the second pin. For example, a state of a pin may be a voltage level applied to the pin, whether the pin is open, whether the pin is shorted to an adjacent pin, and so on. Specifically, the voltage signal generation circuit 220 may include a pull-up circuit 221, a pull-down circuit 222, and a connection circuit 223. A configuration of the voltage signal generation circuit 220 will be described in detail with reference to FIG. 4.

The converting circuit 230 may receive the first and second voltage signals IN1a and IN2a and perform analog-to-digital converting (hereinafter referred to as ADC) on the first and second voltage signals IN1a and IN2a to generate first and second digital signals IN1d and IN2d. The foreign object detection block 240 may receive the first and second digital signals IN1d and IN2d and generate a detection signal indicating whether foreign objects are present on the plurality of pins P1 to Pn based on the first and second digital signals IN1d and IN2d. In some example embodiments, the foreign object detection block 240 may be implemented as a Micro Controller Unit (MCU) or other hardware. The operations described herein as being performed by the foreign object detection block 240 may be performed by the MCU executing firmware instructions stored in a memory.

Figure 4:
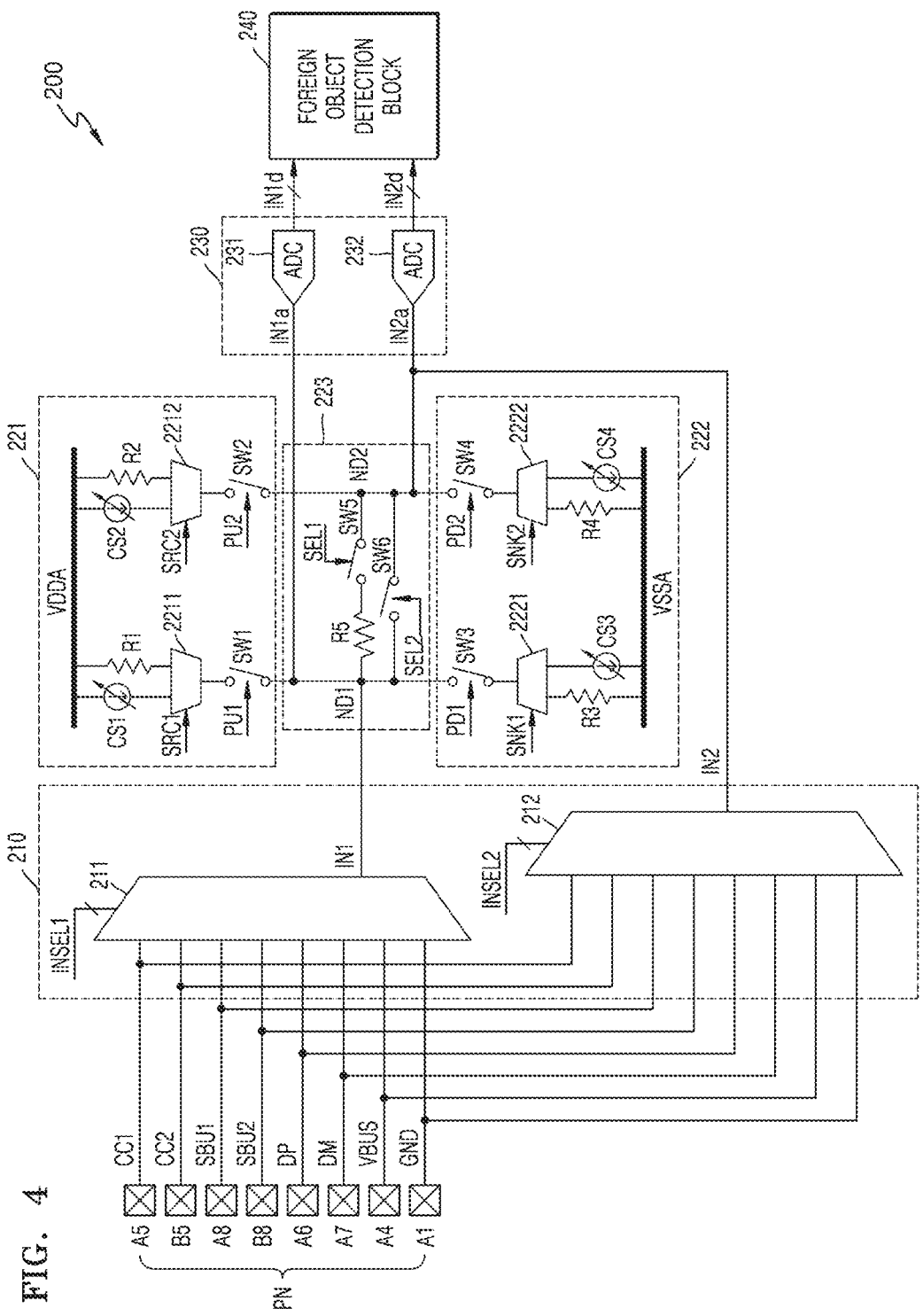
FIG. 4 is a circuit diagram showing a detection circuit in which each of the pull-up circuit and pull-down circuit includes two current sources, two resistors and two selectors, according to some example embodiments.

FIG. 4 is a circuit diagram showing the detection circuit 200 according to some example embodiments. Referring to FIG. 4, each of the pull-up circuit and pull-down circuit of the detection circuit 200 includes two current sources, two resistors and two selectors. The detection circuit 200 may be electrically connected to the plurality of pins PN. For example, the plurality of pins PN may be the CC1 pin A5, the CC2 pin B5, the SBU1 pin A8, the SBU2 pin B8, the DP pin A6, the DM pin A7, the VBUS pin A4, and the GND pin A1. However, types and number of the pins PN connected to the detection circuit 200 may be variously changed according to some example embodiments.

The selection circuit 210 may include first and second selectors 211 and 212. The first selector 211 may select a first pin of the plurality of pins PN according to a first input selection signal INSEL1, output the first input IN1 from the selected first pin, and provide the first input IN1 to a first node ND1. Similarly, the second selector 212 may select a second pin of the plurality of pins PN according to a second input selection signal INSEL2, output the second input IN2 from the selected second pin, and provide the second input IN2 to a second node ND2. In some example embodiments, each of the first and second selectors 211 and 212 may be implemented as a multiplexer. In some example embodiments, the first and second input selection signals INSEL1 and INSEL2 may be 3-bit digital signals. In some example embodiments, the first and second input signals INSEL1 and INSEL2 may be generated from a controller (e.g., 260 of FIG. 17) included in the PDIC.

The pull-up circuit 221 may include a first current source CS1, a first resistor R1, a first source selector 2211, and a first pull-up selection switch SW1 connected to a power voltage terminal VDDA. The first source selector 2211 may select one of the first current source CS1 and the first resistor R1 as a pull-up device according to a first source select signal SRC1. The first pull-up selection switch SW1 may connect an output terminal of the first source selector 2211 to the first node ND1 according to a first pull-up selection signal PU1 The pull-up circuit 221 may further include a second current source CS2, a second resistor R2, a second source selector 2212 and a second pull-up selection switch SW2 connected to the power voltage terminal VDDA. The second source selector 2212 may select one of the second current source CS2 and the second resistor R2 as the pull-up device according to a second source selection signal SRC2. The second pull-up selection switch SW2 may connect an output terminal of the second source selector 2212 to the second node ND2 according to the second pull-up selection signal PU2.

The pull-down circuit 222 may include a third current source CS3, a third resistor R3, a first sync selector 2221 and a first pull-down selection switch SW3 connected to a ground voltage terminal VSSA. The first sync selector 2221 may select one of the third current source CS3 and the third resistor R3 as the pull-down device according to a first sync select signal SNK1. The first pull down selection switch SW3 may connect the output terminal of the first sync selector 2221 to the first node ND1 according to the first pull down selection signal PD1. The pull-down circuit 222 may further include a fourth current source CS4, a fourth resistor R4, a second sync selector 2222 and a second pull down selection switch SW4 connected to the ground voltage terminal VSSA. The second sync selector 2222 may select one of the fourth current source CS4 and the fourth resistor R4 as the pull-down device according to a second sync select signal SNK2. The second pull down selection switch SW4 may connect the output terminal of the second sync selector 2222 to the second node ND2 according to the second pull down selection signal PD2.

In some example embodiments, the first and second source selectors 2211 and 2212 and the first and second sync selectors 2221 and 2222 may each be implemented as a multiplexer. In some example embodiments, the first and second source select signals SRC1 and SRC2 and the first and second sync select signals SNK1 and SNK2 may be 1-bit digital signals. In some example embodiments, the first and second source select signals SRC1 and SRC2, the first and second sync select signals SNK1 and SNK2, the first and second pull-up select signals PU1 and PU2, and the first and second pull down selection signals PD1 and PD2 may be generated from a controller (for example, 260 in FIG. 17) included in the PDIC. In some example embodiments, each of the first through fourth current sources CS1 through CS4 may provide current of about 1 μA to about 1 mA. In some example embodiments, each of the first through fourth resistors R1 through R4 may be between about 1 KΩ and about 1 MΩ.

The connection circuit 223 may include a fifth resistor R5 and first and second connection selection switches SW5 and SW6. The fifth resistor R5 and the first connection selection switch SW5 may be disposed between the first and second nodes ND1 and ND2 and may be connected in series with each other. The second connection selection switch SW6 may be disposed between the first and second nodes ND1 and ND2 and may be connected in parallel with the fifth resistor R5 and the first connection selection switch SW5. The first connection selection switch SW5 may be turned on/off according to the first connection selection signal SEL1. The second connection selection switch SW6 may be turned on/off according to the second connection selection signal SEL2. The first and second connection selection signals SEL1 and SEL2 may be generated from a controller (for example, 260 in FIG. 17) included in the PDIC.

The converting circuit 230 may include first and second ADCs 231 and 232. The first ADC 231 may receive the first voltage signal IN1$a$ of the first node ND1 and perform ADC on the received first voltage signal IN1$a$ to generate the first digital signal IN1$d$. The second ADC 232 may receive the second voltage signal IN2$a$ of the second node ND2 and perform ADC on the received second voltage signal IN2$a$ to generate the second digital signal IN2$d$.

In some example embodiments, the foreign object detection block 240 may calculate a pin-to-pin impedance between the first pin and the second pin based on the first and second digital signals IN1$d$ and IN2$d$ and generate a detection signal DS based on the calculated pin-to-pin impedance. For example, if the pin-to-pin impedance corresponds to a normal impedance, the foreign object detection block 240 may generate the detection signal DS indicating that no foreign object is present, and if the pin-to-pin impedance does not correspond to the normal impedance, the foreign object detection block 240 may generate the detection signal DS indicating that a foreign object is present.

In some example embodiments, the foreign object detection block 240 may calculate a first impedance between the first pin and the ground voltage terminal VSSA and a second impedance between the second pin and the ground voltage terminal VSSA based on the first and second digital signals IN1$d$ and IN2$d$ and generate the detection signal DS based on the calculated first and second impedances. In some example embodiments, the foreign object detection block 240 may determine whether the first and second pins are opened based on the first and second digital signals IN1$d$ and IN2$d$ and generate the detection signal DS according to a result of the determination. Some example embodiments in which the foreign object detection block 240 detects a foreign object will be described in detail with reference to FIGS. 7A to 13.

Figure 5:
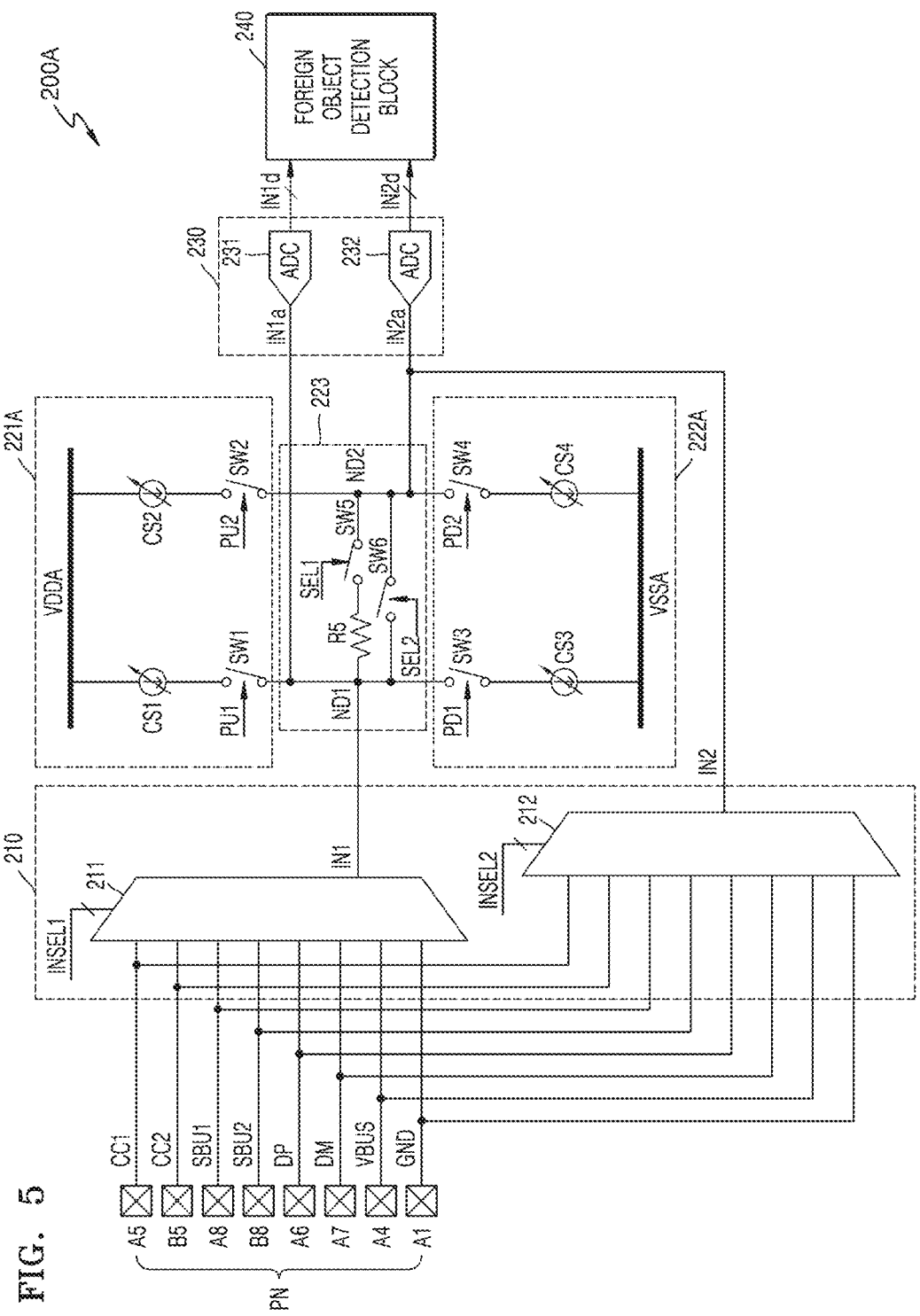
FIG. 5 is a circuit diagram illustrating a modification of the detection circuit of FIG. 4 in which each of the pull-up circuit and pull-down circuit includes two current sources, according to some example embodiments.

FIG. 5 is a circuit diagram illustrating a modification 200A of the detection circuit 200 of FIG. 4 in which each of the pull-up circuit and pull-down circuit includes two current sources, according to some example embodiments.

Referring to FIG. 5, the detection circuit 200A may correspond to a modification of the detection circuit 200 of FIG. 4. The above description with reference to FIG. 4 may also be applied to the description of FIG. 5. Specifically, the detection circuit 200A may be different from the detection circuit 200 of FIG. 4 in configurations of a pull-up circuit 221A and a pull-down circuit 222A. Hereinafter, the pull-up circuit 221A and the pull-down circuit 222A will be mainly described.

The pull-up circuit 221A may include the first current source CS1 and the first pull-up selection switch SW1 that are connected to the power supply voltage terminal VDDA. The first pull-up selection switch SW1 may connect the first current source CS1 to the first node ND1 according to the first pull-up selection signal PU1 and may provide current to the first node ND1. Also, the pull-up circuit 221A may further include a second current source CS2 and a second pull-up selection switch SW2 that are connected to the power voltage terminal VDDA. The second pull-up selection switch SW2 may connect the second current source CS2 to the second node ND2 according to the second pull-up selection signal PU2 and may provide current to the second node ND2.

The pull-down circuit 222A may include the third current source CS3 and the first pull down select switch SW3 that are connected to the ground voltage terminal VSSA. The first pull down selection switch SW3 may connect the third current source CS3 to the first node ND1 according to the first pull down selection signal PD1 and may provide current to the first node ND1. The pull-down circuit 222A may further include the fourth current source CS4 and the second pull down selection switch SW4 that are connected to the ground voltage terminal VSSA. The second pull down selection switch SW4 may connect the fourth current source CS4 to the second node ND2 according to the second pull down selection signal PD2 and may provide current to the second node ND2.

Figure 6:
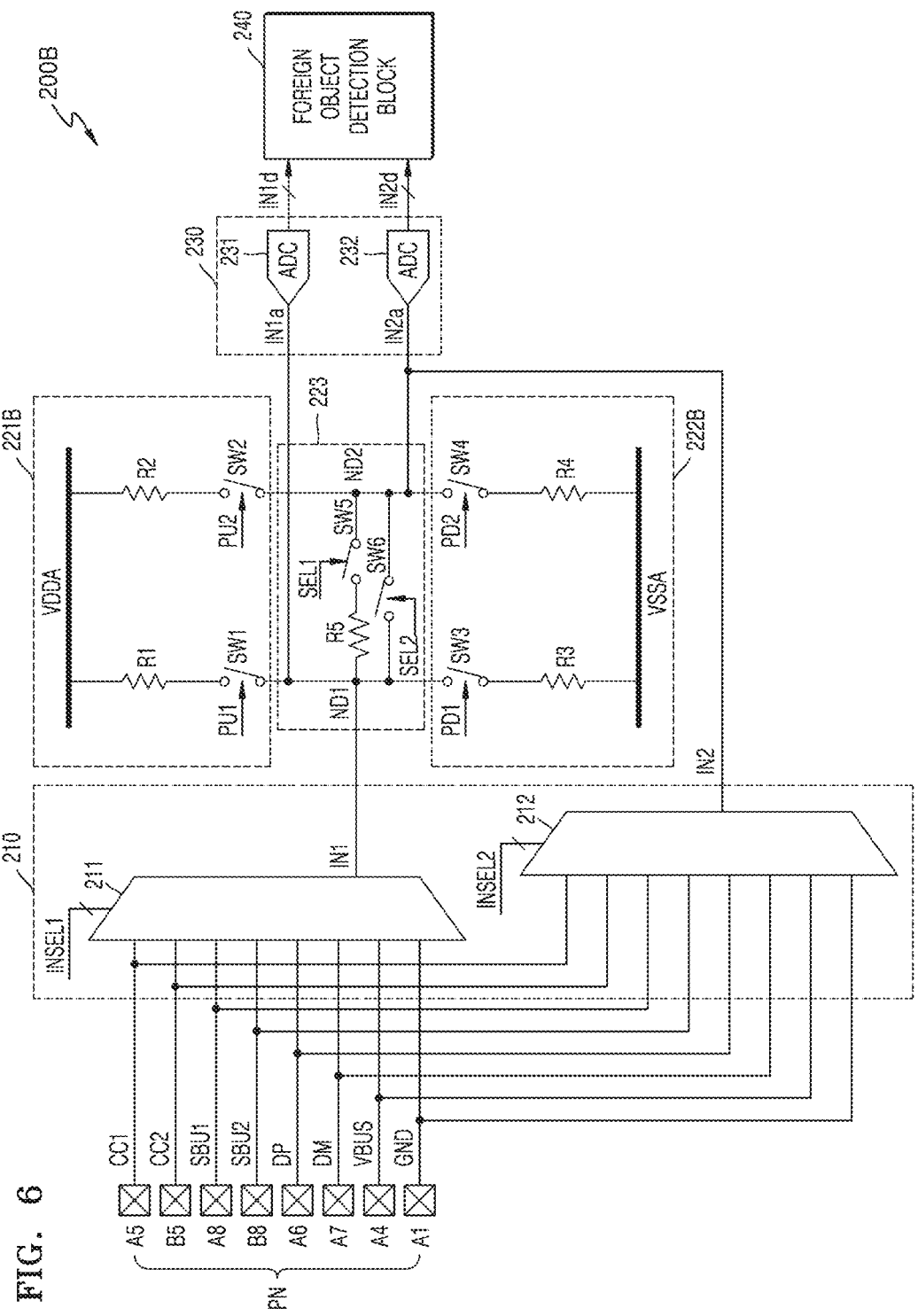
FIG. 6 is a circuit diagram illustrating a modification of the detection circuit of FIG. 4 in which each of the pull-up circuit and pull-down circuit includes two resistors, according to some example embodiments.

FIG. 6 is a circuit diagram illustrating detection circuit 200B in which each of the pull-up circuit and pull-down circuit includes two resistors, according to some example embodiments.

Referring to FIG. 6, the detection circuit 200B corresponds to a modification of the detection circuit 200 of FIG. 4, and the above description with reference to FIG. 4 may also be applied to the description of FIG. 6. Specifically, the detection circuit 200B may be different from the detection circuit 200 of FIG. 4 in configurations of a pull-up circuit 221B and a pull-down circuit 222B. Hereinafter, the pull-up circuit 221B and the pull-down circuit 222B will be mainly described.

The pull-up circuit 221B may include the first resistor R1 and the first pull-up selection switch SW1 that are connected to the power supply voltage terminal VDDA. The first pull-up selection switch SW1 may connect the first resistor R1 to the first node ND1 according to the first pull-up selection signal PU1. Also, the pull-up circuit 221B may further include the second resistor R2 and the second pull-up selection switch SW2 that are connected to the power supply voltage terminal VDDA. The second pull-up selection switch SW2 may connect the second resistor R2 to the second node ND2 according to the second pull-up selection signal PU2.

The pull-down circuit 222B may include the third resistor R3 and the first pull down selection switch SW3 that are connected to the ground voltage terminal VSSA. The first pull down selection switch SW3 may connect the third resistor R3 to the first node ND1 according to the first pull down selection signal PD1. Also, the pull-down circuit 222B may further include the fourth resistor R4 and the second pull-down selection switch SW4 that are connected to the ground voltage terminal VSSA. The second pull down select switch SW4 may connect the fourth resistor R4 to the second node ND2 according to the second pull down select signal PD2.

In some example embodiments, a detection circuit may be implemented to include the pull-up circuit 221A of FIG. 5 and the pull-down circuit 222B of FIG. 6. In some example embodiments, a detection circuit may be implemented to include the pull-up circuit 221B of FIG. 6 and the pull-down circuit 222A of FIG. 5. In some example embodiments, a detection circuit may be implemented to include the pull-up circuit 221 of FIG. 4 and the pull-down circuit 222A of FIG. 5 or the pull-down circuit 222B of FIG. 6. In some example embodiments, a detection circuit may be implemented to include the pull-up circuit 221A of FIG. 5 or the pull-up circuit 221B of FIG. 6 and the pull-down circuit 222 of FIG. 4.

Hereinafter, various operation examples of the detection circuit 200 of FIG. 4 will be described with reference to FIGS. 7A to 13. The above description with reference to FIGS. 4 to 6 may also be applied to FIGS. 7A to 13, and a redundant description thereof will be omitted. In some example embodiments, the pull-up circuit 221 of FIGS. 7A through 13 may be replaced by the pull-up circuit 221A of FIG. 5 or the pull-up circuit 221B of FIG. 6. Also, in some example embodiments, the pull-down circuit 222 of FIGS. 7A through 13 may be replaced by the pull-down circuit 222A of FIG. 5 or the pull-down circuit 222B of FIG. 6.

Figure 7A:
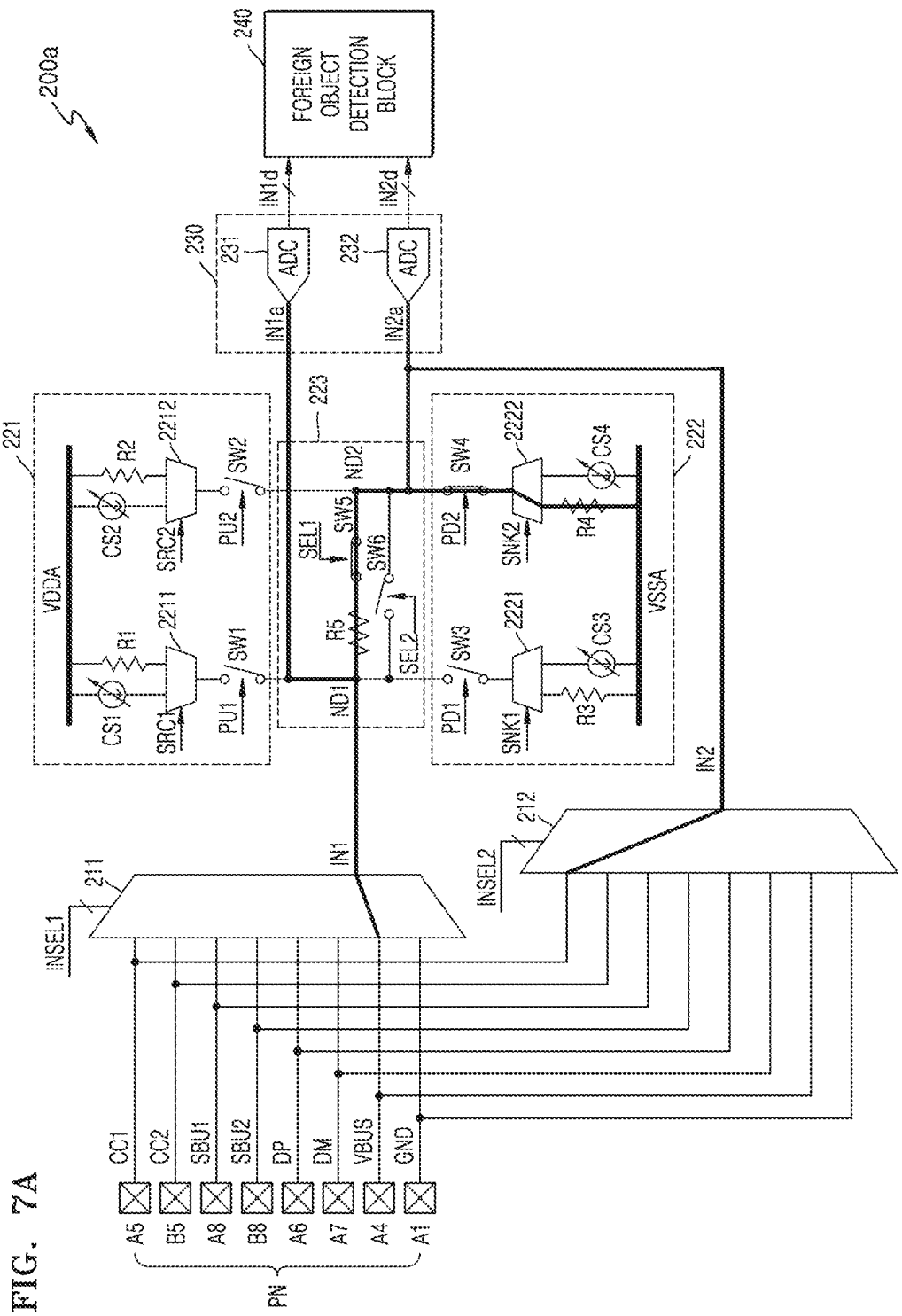
FIG. 7A shows an example of a detection circuit $200a$ measuring an impedance between a selected first pin and a selected second pin, according to some example embodiments
Figure 7B:
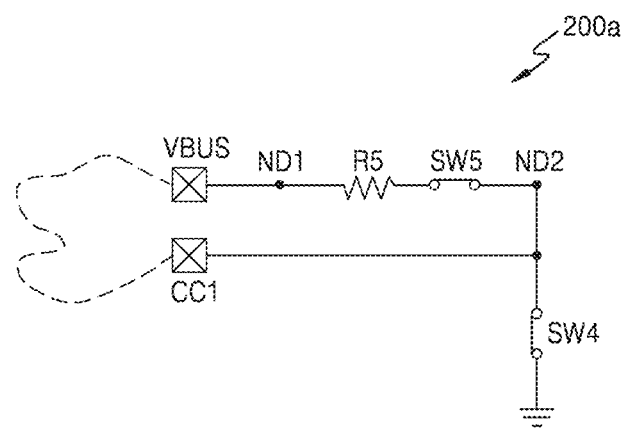
FIG. 7B is an equivalent circuit diagram of FIG. 7A.

FIG. 7A shows an example of a detection circuit 200a measuring an impedance between a selected first pin and a selected second pin, according to some example embodiments. FIG. 7B is an equivalent circuit diagram of FIG. 7A.

Referring to FIGS. 7A and 7B, the detection circuit 200a may measure an impedance between a selected first pin and a selected second pin. For example, the selected first pin may be the VBUS pin A4 and the selected second pin may be the CC1 pin A5. Specifically, the first selector 211 may select the VBUS pin A4 according to the first input selection signal INSEL1 and output the first input IN1 from the selected VBUS pin A4. The second selector 212 may select the CC1 pin A5 according to the second input selection signal INSEL2 and output the second input IN2 from the selected CC1 pin A5. For example, the first input selection signal INSEL1 may be '110' and the second input selection signal INSEL2 may be '000'.

The first and second pull-up selection signals PU1 and PU2 and the first pull down selection signal PD1 may be inactivated and the second pull down selection signal PD2 may be activated. Also, the first connection selection signal SEL1 may be activated and the second connection selection signal SEL2 may be inactivated. Thus, the second pull down selection switch SW4 and the first connection selection switch SW5 may be turned on. Also, the second sync selector 2222 may select the fourth resistor R4 as a pull-down device, and accordingly, the fourth resistor R4 and the second pull-down selection switch SW4 may be connected.

A state (hereinafter referred to as a "normal state") where no foreign object is present on the VBUS pin A4 and the CC1 pin A5 may be a state where a VBUS voltage is applied to the VBUS pin A4 and no voltage is applied to the CC1 pin A5. Therefore, a voltage level of the first node ND1 may be the same as the VBUS voltage, and a voltage level of the second node ND2 may have a voltage level distributed from the VBUS voltage by the fourth resistor R4 and the fifth resistor R5. For example, when the VBUS voltage is 5 V and resistance values of the fourth resistor R4 and the fifth resistor R5 are the same as each other, the voltage level of the first node ND1 may correspond to 5 V, and the voltage level of the second node ND2 may correspond to 2.5 V.

In the normal state, the first ADC 231 may receive the first voltage signal IN1a corresponding to the voltage level of the first node ND1 and perform ADC on the received first voltage signal IN1a to generate the first digital signal IN1d. The second ADC 232 may receive the second voltage signal IN2a corresponding to the voltage level of the second node ND2 and perform ADC on the received second voltage signal IN2a to generate the second digital signal IN2d. The foreign object detection block 240 may receive the first and second digital signals IN1*d* and IN2*d* and calculate a normal impedance between the first node ND1 and the second node ND2 according to Ohm's law using the received first and second digital signals IN1*d* and IN2*d*.

On the other hand, a short circuit may occur between the VBUS pin A4 and the CC1 pin A5 in a state (hereinafter referred to as a "foreign object state") where there is a foreign object on the VBUS pin A4 and the CC1 pin A5. As a result, a resistance value between the VBUS pin A4 and the CC1 pin A5 may be reduced, for example, close to 0Ω. At this time, resistance between the VBUS pin A4 and the CC1 pin A5 and the fifth resistor R5 may be regarded as being connected in parallel. A parallel resistance value may be changed to a foreign object resistance value close to 0Ω. Therefore, the voltage level of the second node ND2 may be higher than a voltage level in the normal state, for example, 2.5V. At this time, the voltage level of the first node ND1 may correspond to the voltage level in the normal state, for example, 5V.

The second voltage signal IN2*a* corresponding to the voltage level of the second node ND2 in the foreign object state may be different from the second voltage signal IN2*a* in the normal state, and accordingly the second digital signal IN2*d* may be different from the second digital signal IN2*d* in the normal state. The foreign object detection block 240 may calculate the impedance between the first node ND1 and the second node ND2 according to Ohm's law using the received first and second digital signals IN1*d* and IN2*d*, where the calculated impedance may be different from the normal impedance. Therefore, the foreign object detection block 240 may determine that a foreign object is detected on a connector and may activate a detection signal.

Figure 8A:
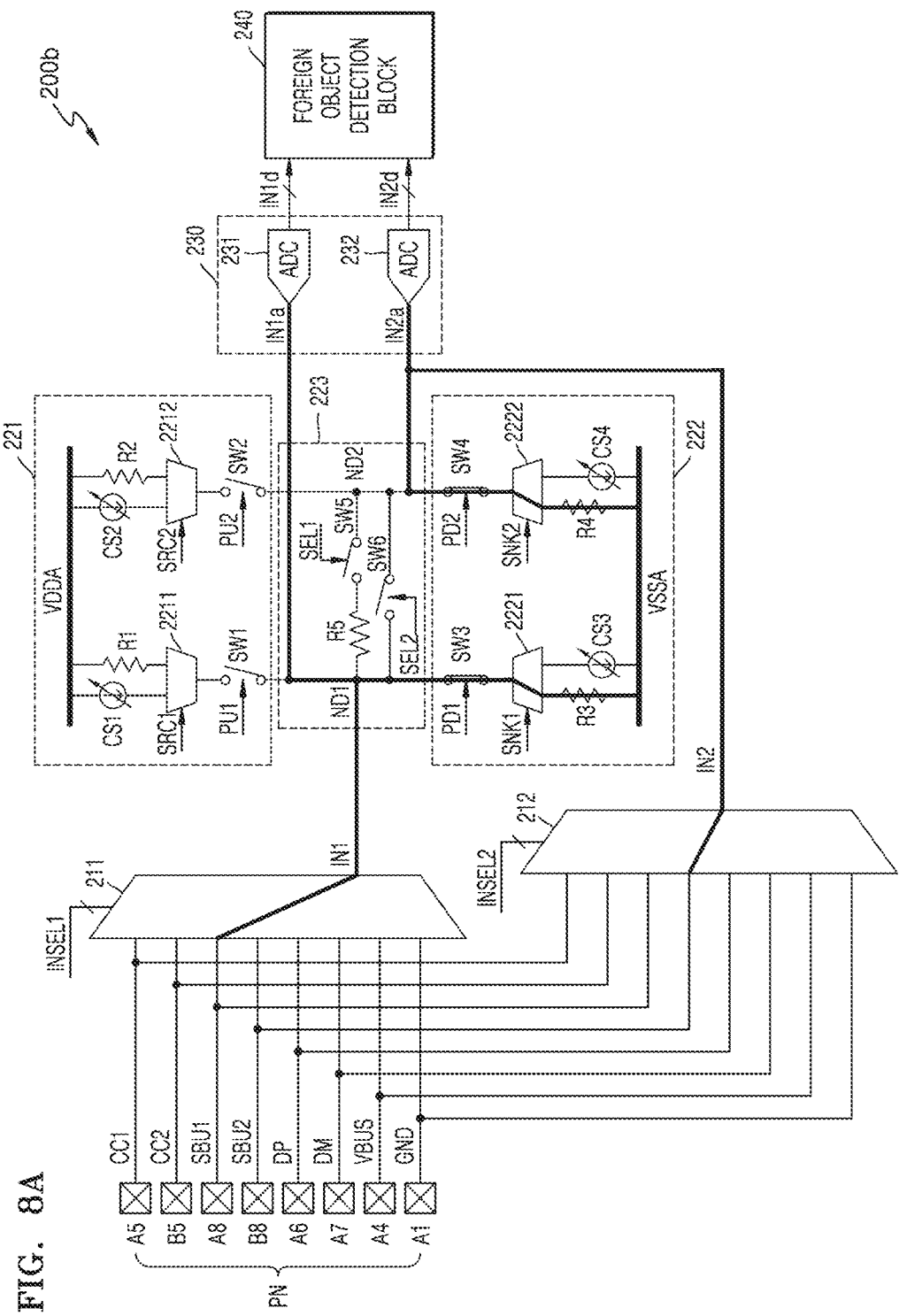
FIG. 8A shows an example of a detection circuit measuring an impedance between selected pins and a ground voltage terminal, according to some example embodiments
Figure 8B:
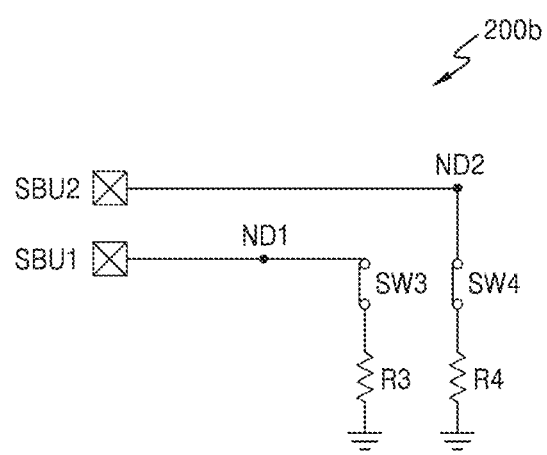
FIG. 8B is an equivalent circuit diagram of FIG. 8A.

FIG. 8A shows an example of a detection circuit 200*b* measuring an impedance between selected pins and a ground voltage terminal, according to some example embodiments. FIG. 8B is an equivalent circuit diagram of FIG. 8A.

Referring to FIGS. 8A and 8B, the detection circuit 200*b* may measure an impedance between a selected first pin and a ground voltage terminal, and measure an impedance between a selected second pin and the ground voltage terminal. For example, the selected first pin may be the SBU1 pin A8 and the selected second pin may be the SBU2 pin B8. Specifically, the first selector 211 may select the SBU1 pin A8 according to the first input selection signal INSEL1, and output the first input IN1 from the selected SBU1 pin A8. The second selector 212 may select the SBU2 pin B8 according to the second input selection signal INSEL2 and output the second input IN2 from the selected SBU2 pin B8. For example, the first input selection signal INSEL1 may be '010' and the second input selection signal INSEL2 may be '011'.

The first and second pull-up selection signals PU1 and PU2 may be deactivated. The first and second pull down selection signals PD1 and PD2 may be activated. The first and second connection selection signals SEL1 and SEL2 may be deactivated. Accordingly, the first and second pull down selection switches SW3 and SW4 may be turned on. The first and second sync selectors 2221 and 2222 may also select the third and fourth resistors R3 and R4 as pull-down devices, respectively, and accordingly the third resistor R3 and the first pull-down selection switch SW3 may be connected, and the fourth resistor R4 and the second pull-down selection switch SW4 may be connected.

In a normal state in which there is no foreign object on the SBU1 pin A8 and the SBU2 pin B8, a voltage level of the first node ND1 may have a first voltage level corresponding to the third resistor R3 and a voltage level of the second node ND2 may have a second voltage level corresponding to the fourth resistor R4. The first ADC 231 may generate the first digital signal IN1*d* by performing ADC on the first voltage signal IN1*a* corresponding to the voltage level of the first node ND1 and the second ADC 232 may generate the second digital signal IN2*d* by performing ADC on the second voltage signal IN2*a* corresponding to the voltage level of the second node ND2. The foreign object detection block 240 may calculate a first normal impedance between the SBU1 pin A8 and the ground voltage terminal VSSA according to the first digital signal IN1*d* and calculate a second normal impedance between the SBU2 pin B8 and the ground voltage terminal VSSA according to the second digital signal IN2*d*.

On the other hand, in a state in which there is a foreign object on the SBU1 pin A8 or the SBU2 pin B8, the SBU1 pin A8 or the SBU2 pin B8 may be abnormally electrically connected to an adjacent pin. At this time, the voltage level of the first node ND1 may not correspond to the first voltage level, or the voltage level of the second node ND2 may not correspond to the second voltage level. Accordingly, the first digital signal IN1*d* may be different from the first digital signal IN1*d* in the normal state, or the second digital signal IN2*d* may be different from the second digital signal IN2*d* in the normal state. The foreign object detection block 240 may calculate the first impedance between the SBU1 pin A8 and the ground voltage terminal VSSA according to the first digital signal IN1*d*, wherein the first impedance is different from a first normal impedance. The foreign object detection block 240 may calculate a second impedance between the SBU2 pin B8 and the ground voltage terminal VSSA according to the second digital signal IN2*d*, wherein the second impedance may be different from a second normal impedance. Therefore, the foreign object detection block 240 may determine that a foreign object is detected on a connector, and may activate the detection signal.

Figure 9A:
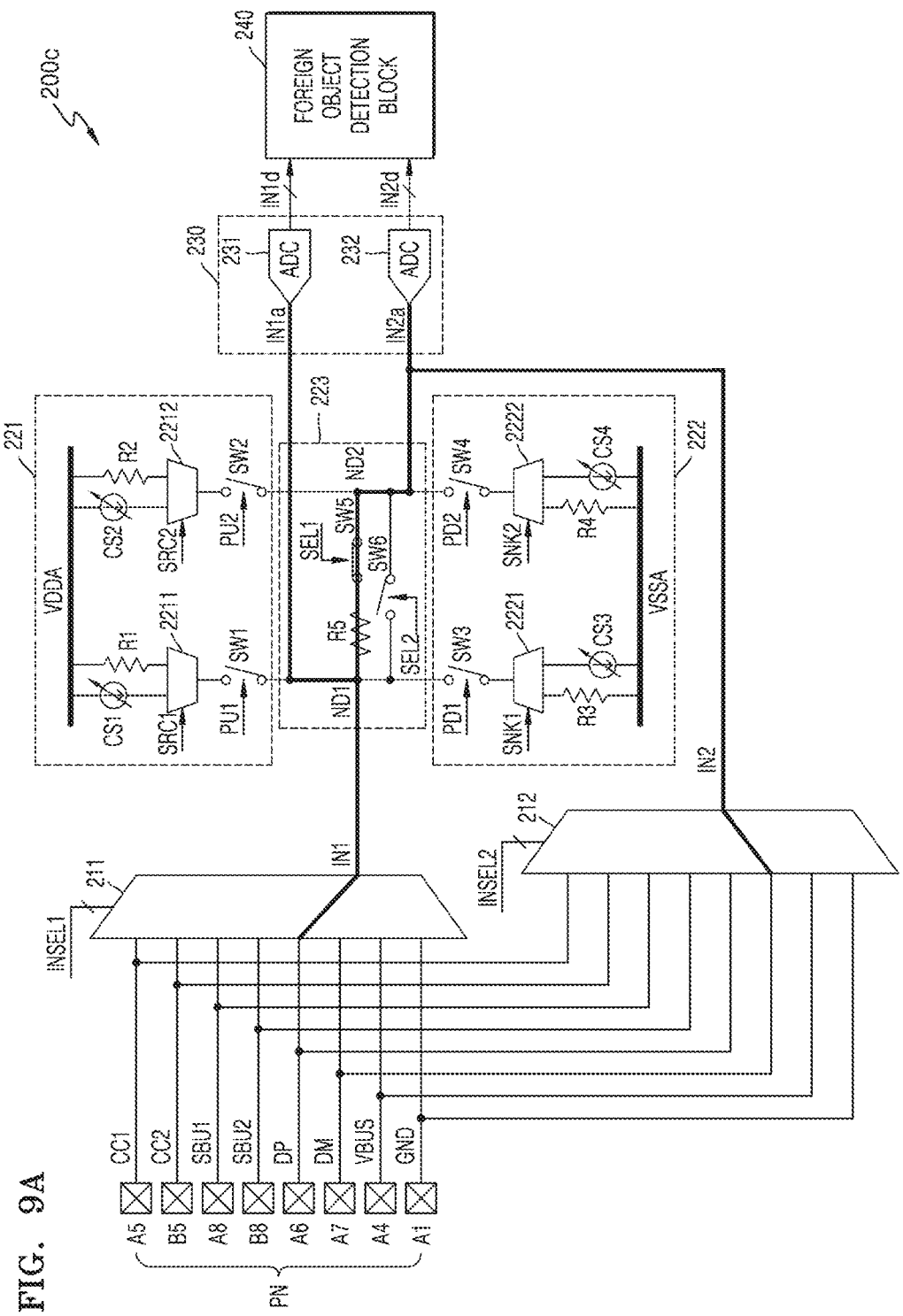
FIG. 9A shows an example of a detection circuit measuring both end voltage of an impedance between a selected first pin and a selected second pin, according to some example embodiments
Figure 9B:
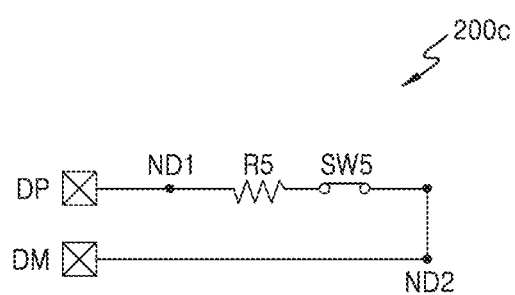
FIG. 9B is an equivalent circuit diagram of FIG. 9A.

FIG. 9A shows an example of a detection circuit 200*c* measuring both end voltage of an impedance between a selected first pin and a selected second pin, according to some example embodiments. FIG. 9B is an equivalent circuit diagram of FIG. 9A.

Referring to FIGS. 9A and 9B, the detection circuit 200*c* may measure both end voltage of an impedance between a selected first pin and a selected second pin. For example, the selected first pin may be the DP pin A6, and the selected second pin may be the DM pin A7. Specifically, the first selector 211 may select the DP pin A6 according to a first input selection signal INSEL1, and may output the first input IN1 from the selected DP pin A6. The second selector 212 may select the DM pin A7 according to a second input selection signal INSEL2 and output the second input IN2 from the selected DM pin A7. For example, the first input selection signal INSEL1 may be '100' and the second input selection signal INSEL2 may be '101'.

The first and second pull-up selection signals PU1 and PU2 and the first and second pull down selection signals PD1 and PD2 may be inactivated. Accordingly, the first and second nodes ND1 and ND2 may not be connected to the pull-up circuit 221 and the pull-down circuit 222, respectively. The first connection selection signal SEL1 may be activated and the second connection selection signal SEL2 may be inactivated. Accordingly, the first connection selection switch SW5 may be turned on and the second connection selection switch SW6 may turned off.

In a normal state in which there is no foreign object on the DP pin A6 and the DM pin A7, a voltage level of the first node ND1 may have a first normal voltage level according to the fifth resistor R5 and a voltage level of the second node ND2 may have a second normal voltage level corresponding to a voltage level of the DM pin A7. The foreign object detection block 240 may calculate a normal impedance between the DP pin A6 and the DM pin A7 based on the first and second digital signals IN1d and IN2d.

On the other hand, the DP pin A6 and the DM pin A7 may be abnormally electrically connected or the DP pin A6 or the DM pin A7 and an adjacent pin may be abnormally electrically connected, in a state where there is a foreign object on the DP pin A6 or the DM pin A7. At this time, the voltage level of the first node ND1 may not correspond to the first normal voltage level, or the voltage level of the second node ND2 may not correspond to the second normal voltage level. Accordingly, the impedance calculated by the foreign object detection block 240 may be different from the normal impedance. Therefore, the foreign object detection block 240 may determine that the foreign object is detected on a connector and may activate a detection signal.

Figure 10A:
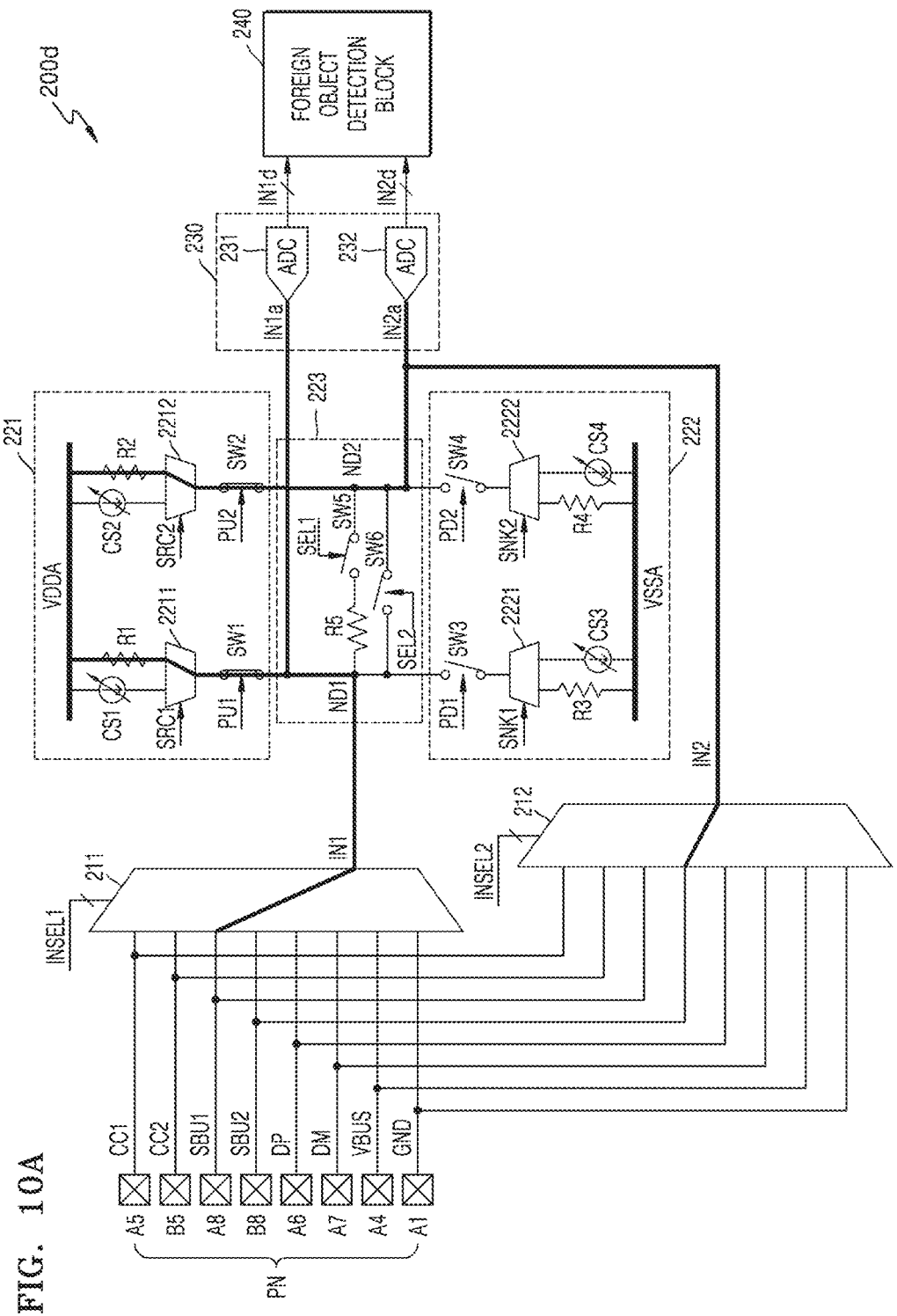
FIG. 10A shows an example of a detection circuit measuring whether selected first and second pins are open using the pull-up circuit, according to some example embodiments.
Figure 10B:
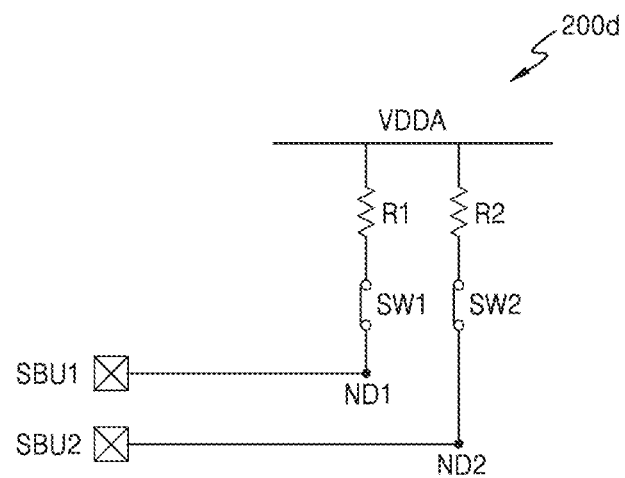
FIG. 10B is an equivalent circuit diagram of FIG. 10A.

FIG. 10A shows an example of a detection circuit 200d measuring whether selected first and second pins are open using the pull-up circuit, according to some example embodiments. FIG. 10B is an equivalent circuit diagram of FIG. 10A.

Referring to FIGS. 10A and 10B, the detection circuit 200d may measure whether selected first and second pins are open. For example, the selected first pin may be the SBU1 pin A8 and the selected second pin may be the SBU2 pin B8. The first and second pull-up selection signals PU1 and PU2 may be activated and the first and second pull-down selection signals PD1 and PD2 may be inactivated. Accordingly, the first and second nodes ND1 and ND2 may be connected to the pull-up circuit 221 and not to the pull-down circuit 222. At this time, the first and second source selectors 2211 and 2212 may select the first and second resistors R1 and R2 as pull-up devices, respectively. The first and second connection selection signals SEL1 and SEL2 may be inactivated and the first and second nodes ND1 and ND2 may not be connected to the connection circuit 223.

In some example embodiments, the SBU1 pin A8 and the SBU2 pin B8 may be in an open state in a normal state where there is no foreign object on the SBU1 pin A8 and the SBU2 pin B8. At this time, a voltage level of the first node ND1 may have a first normal voltage level according to a power supply voltage and the first resistor R1, and a voltage level of the second node ND2 may have a second normal voltage level according to the power supply voltage and the second resistor R2.

On the other hand, in a state where there is a foreign object on the SBU1 pin A8 or the SBU2 pin B8, the SBU1 pin A8 or the SBU2 pin B8 and an adjacent pin may be abnormally electrically connected. At this time, the voltage level of the first node ND1 may not correspond to the first normal voltage level, or the voltage level of the second node ND2 may not correspond to the second normal voltage level. Therefore, the foreign object detection block 240 may determine that the foreign object is detected on a connector, and may activate a detection signal.

Figure 11A:
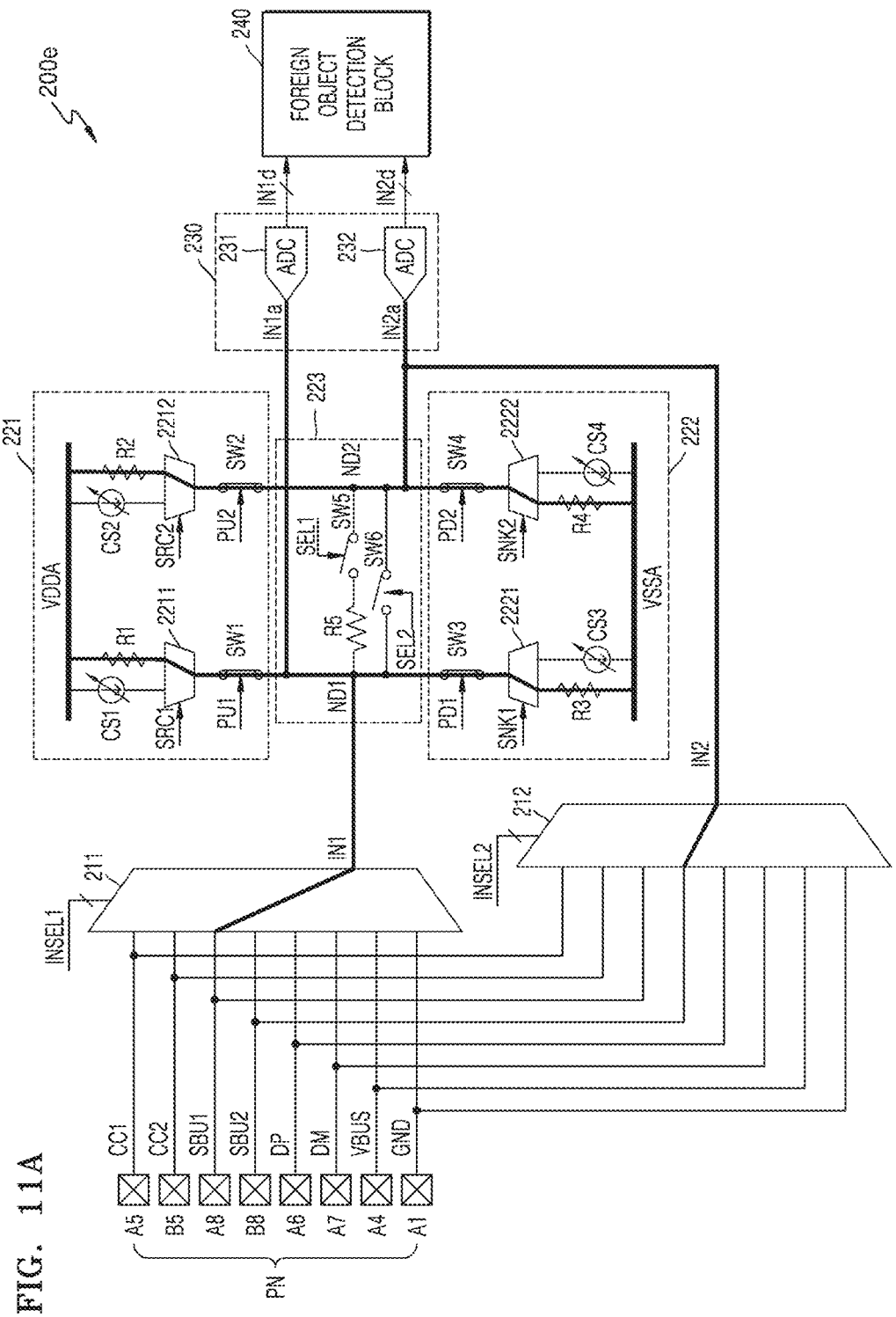
FIG. 11A shows an example of a detection circuit measuring whether selected first and second pins are open using the pull-up circuit and the pull-down circuit, according to some example embodiments.
Figure 11B:
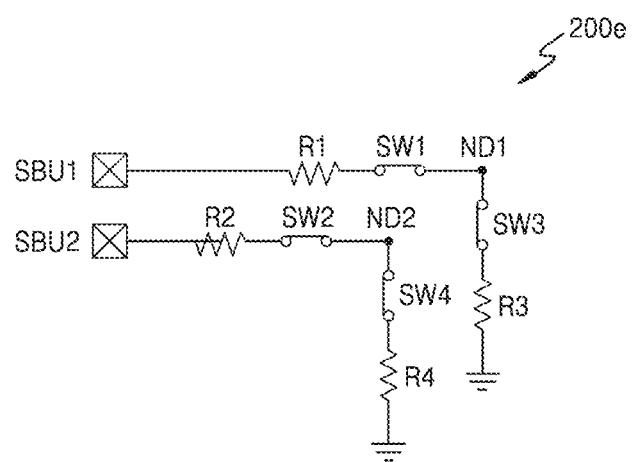
FIG. 11B is an equivalent circuit diagram of FIG. 11A.

FIG. 11A shows an example of a detection circuit 200e measuring whether selected first and second pins are open using the pull-up circuit and the pull-down circuit, according to some example embodiments. FIG. 11B is an equivalent circuit diagram of FIG. 11A.

Referring to FIGS. 11A and 11B, the detection circuit 200e may measure whether selected first and second pins are opened. For example, the selected first pin may be the SBU1 pin A8 and the selected second pin may be the SBU2 pin B8.

The first and second pull-up selection signals PU1 and PU2 and the first and second pull-down selection signals PD1 and PD2 may all be activated. Accordingly, the first and second nodes ND1 and ND2 may be connected to the pull-up circuit 221 and the pull-down circuit 222, respectively. The first and second connection selection signals SEL1 and SEL2 may be inactivated and the first and second nodes ND1 and ND2 may not be connected to the connection circuit 223.

In some example embodiments, the SBU1 pin A8 and the SBU2 pin B8 may be in an open state in a normal state where there is no foreign object on the SBU1 pin A8 and the SBU2 pin B8. At this time, a voltage level of the first node ND1 may have a first normal voltage level distributed from a power supply voltage by the first and third resistors R1 and R3, and a voltage level of the second node ND2 may have a second normal voltage level distributed from the supply voltage by the second and fourth resistors R2 and R4.

On the other hand, in a state where there is a foreign object on the SBU1 pin A8 or the SBU2 pin B8, the SBU1 pin A8 or the SBU2 pin B8 and an adjacent pin may be abnormally electrically connected. At this time, the voltage level of the first node ND1 may not correspond to the first normal voltage level, or the voltage level of the second node ND2 may not correspond to the second normal voltage level. Accordingly, the foreign object detection block 240 may determine that the foreign object is detected on a connector and may activate a detection signal.

Figure 12A:
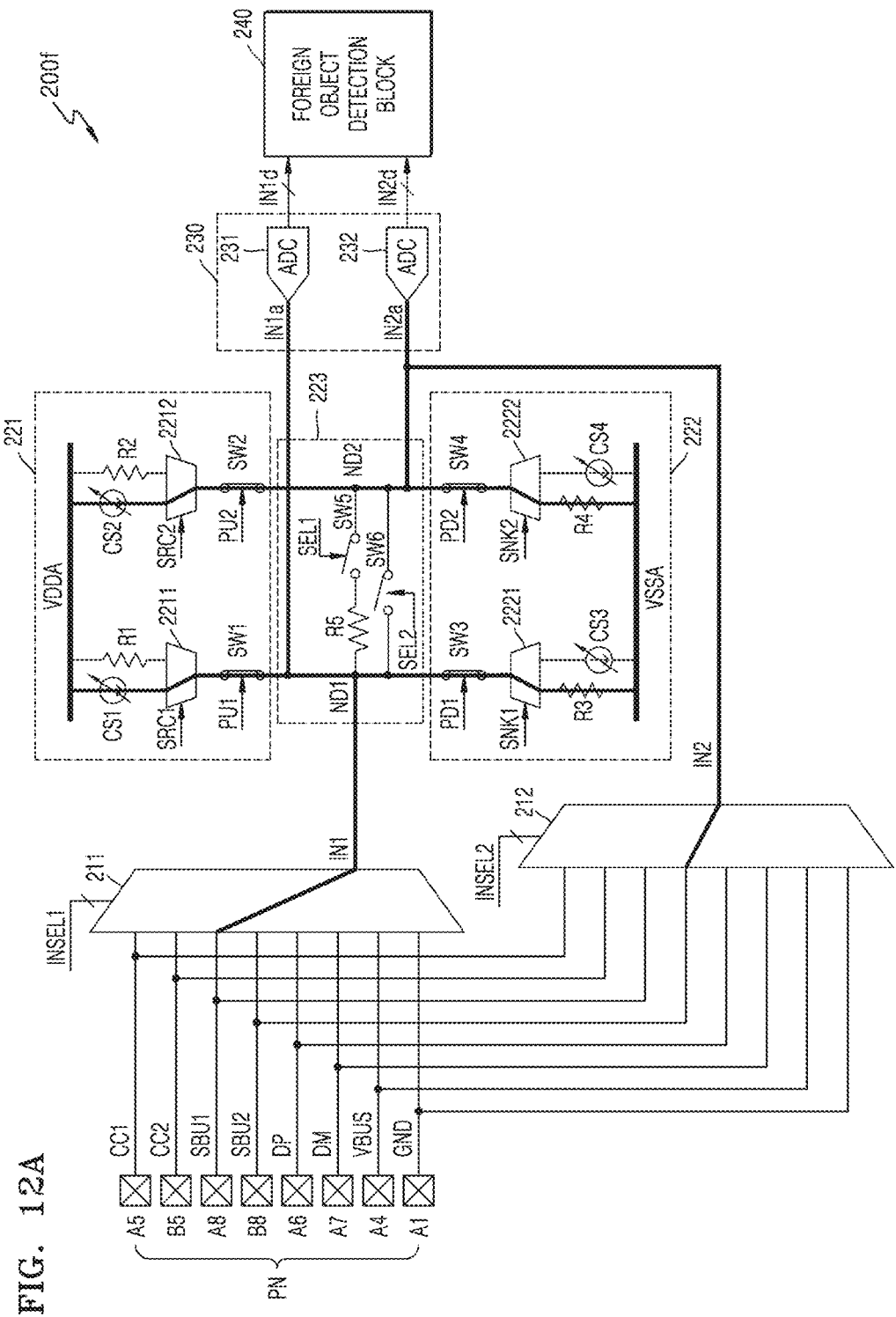
FIG. 12A shows an example of a detection circuit measuring leakage current of selected first and second pins, according to some example embodiments.
Figure 12B:
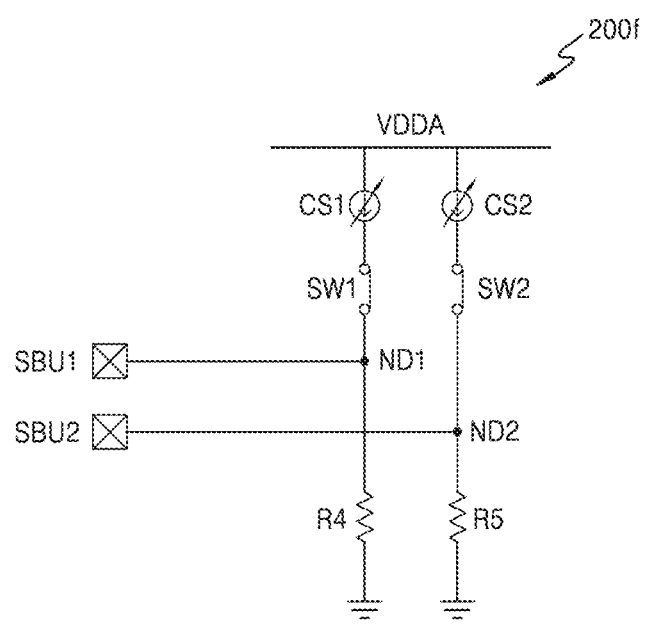
FIG. 12B is an equivalent circuit diagram of FIG. 12A.

FIG. 12A shows an example of a detection circuit 200f measuring leakage current of selected first and second pins, according to some example embodiments, and FIG. 12B is an equivalent circuit diagram of FIG. 12A.

Referring to FIGS. 12A and 12B, the detection circuit 200f may measure leakage current of selected first and second pins. For example, the selected first pin may be the SBU1 pin A8 and the selected second pin may be the SBU2 pin B8. The first and second pull-up selection signals PU1 and PU2 and the first and second pull-down selection signals PD1 and PD2 may all be activated. Accordingly, the first and second nodes ND1 and ND2 may be connected to the pull-up circuit 221 and the pull-down circuit 222, respectively. At this time, the first and second source selectors 2211 and 2212 may select the first and second current sources CS1 and CS2 as pull-up devices, respectively, and first and second sync selectors 2221 and 2222 may select the third and fourth resistors R3 and R4 as pull-down devices, respectively. The first and second connection selection signals SEL1 and SEL2 may be inactivated and the first and second nodes ND1 and ND2 may not be connected to the connection circuit 223.

In some example embodiments, the SBU1 pin A8 and the SBU2 pin B8 may be in an open state in a normal state where there is no foreign object on the SBU1 pin A8 and the SBU2 pin B8. At this time, a voltage level of the first node ND1 may have a first normal voltage level according to a product of first current output from the first current source CS1 and the third resistor R3, and a voltage level of the second node ND2 may have a second normal voltage level according to a product of second current output from the second current source CS2 and the fourth resistor R4.

On the other hand, in a state where there is a foreign object on the SBU1 pin A8 or the SBU2 pin B8, the SBU1 pin A8 or the SBU2 pin B8 and an adjacent pin may be abnormally electrically connected. At this time, the voltage level of the first node ND1 may not correspond to the first normal voltage level, or the voltage level of the second node ND2 may not correspond to the second normal voltage level. Accordingly, the foreign object detection block 240 may determine that the foreign object is detected on a connector and may activate a detection signal.

Figure 13:
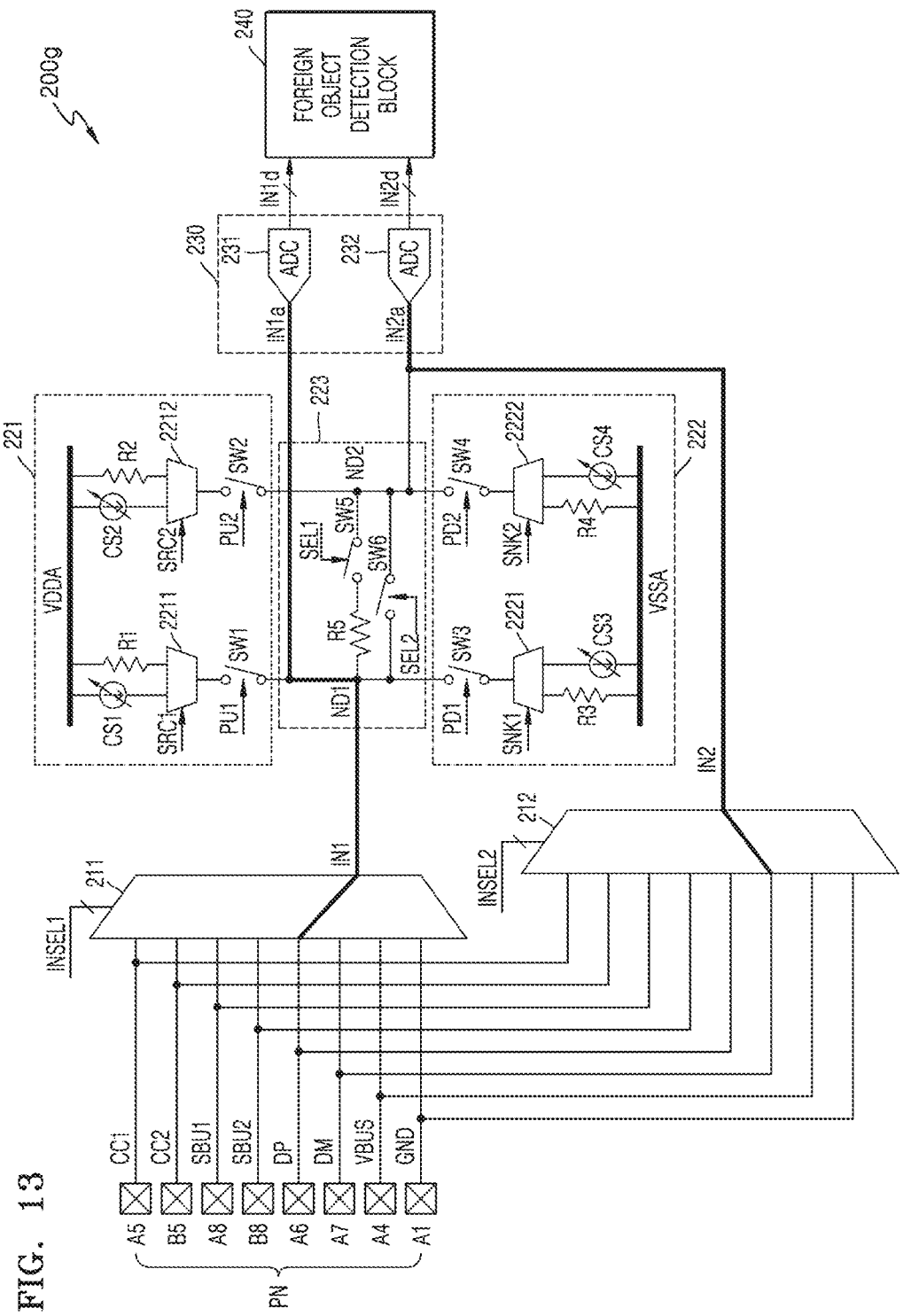
FIG. 13 shows an example of a detection circuit measuring the voltages of selected first and second pins, according to some example embodiments.

FIG. 13 shows an example of a detection circuit 200g measuring the voltages of selected first and second pins, according to some example embodiments.

Referring to FIG. 13, the detection circuit 200g may measure voltage of a selected first pin and voltage of a selected second pin. For example, the selected first pin may be the DP pin A6, and the selected second pin may be the DM pin A7. The first and second pull-up selection signals PU1 and PU2 and the first and second pull-down selection signals PD1 and PD2 may be deactivated. The first and second nodes ND1 and ND2 may not be connected to the pull-up circuit 221 and the pull-down circuit 222, respectively. The first and second connection selection signals SEL1 and SEL2 may be inactivated. The first and second nodes ND1 and ND2 may not be connected to the connection circuit 223.

In a normal state in which there is no foreign object on the DP pin A6 and the DM pin A7, a voltage level of the first node ND1 may have a first normal voltage level that is the same as a voltage level of the DP pin A6 and a voltage level of the second node ND2 may have a second normal voltage level that is the same as a voltage level of the DM pin A7.

On the other hand, the DP pin A6 and the DM pin A7 may be abnormally electrically connected or the DP pin A6 or the DM pin A7 and an adjacent pin may be abnormally electrically connected in a state where there is a foreign object on the DP pin A6 or the DM pin A7. At this time, a voltage level of the first node ND1 may not correspond to the first normal voltage level, or a voltage level of the second node ND2 may not correspond to the second normal voltage level. Accordingly, the foreign object detection block 240 may determine that the foreign object is detected on a connector and may activate a detection signal.

Figure 14:
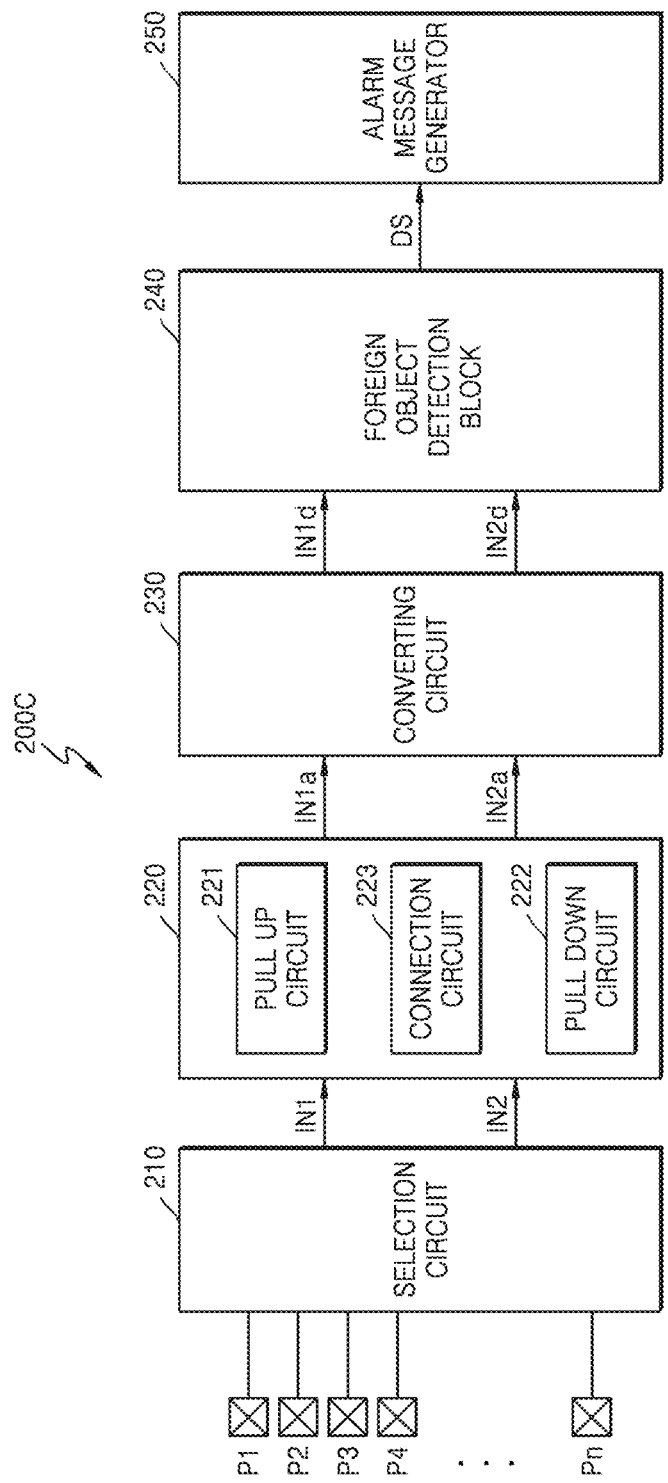
FIG. 14 is a block diagram illustrating an example of the detection circuit of FIG. 3 including an alarm message generator, according to some example embodiments.

FIG. 14 is a block diagram illustrating an example 200C of the detection circuit 200 of FIG. 3 including an alarm message generator, according to some example embodiments.

Referring to FIG. 14, the detection circuit 200C may further include an alarm message generator 250 as compared with the detection circuit 200 of FIG. 3. In some example embodiments, the detection circuit 200C may be implemented as part of a PDIC. The above description with reference to FIGS. 3 to 13 may be applied to FIG. 14, and redundant descriptions will be omitted. According to some example embodiments, operations described herein as being performed by the alarm message generator 250 may be performed by at least one processor (e.g., the application processor 300) executing program code that includes instructions corresponding to the operations. The instructions may be stored in a memory. According to some example embodiments, operations described herein as being performed by the alarm message generator 250 may be performed by a MCU executing stored firmware instructions.

The alarm message generator 250 may receive the detection signal DS from the foreign object detection block 240 and generate a foreign object alarm message informing a user that there is a foreign object on a connector based on the received detection signal DS. In some example embodiments, the foreign object alarm message may be implemented as a visual signal, an audible signal or vibration that may be recognized by the user, and may be provided to the user through a display, a speaker, or the like of an electronic device. Also, the alarm message generator 250 may limit voltage or current supplied to a VBUS pin among a plurality of pins.

Figure 15:
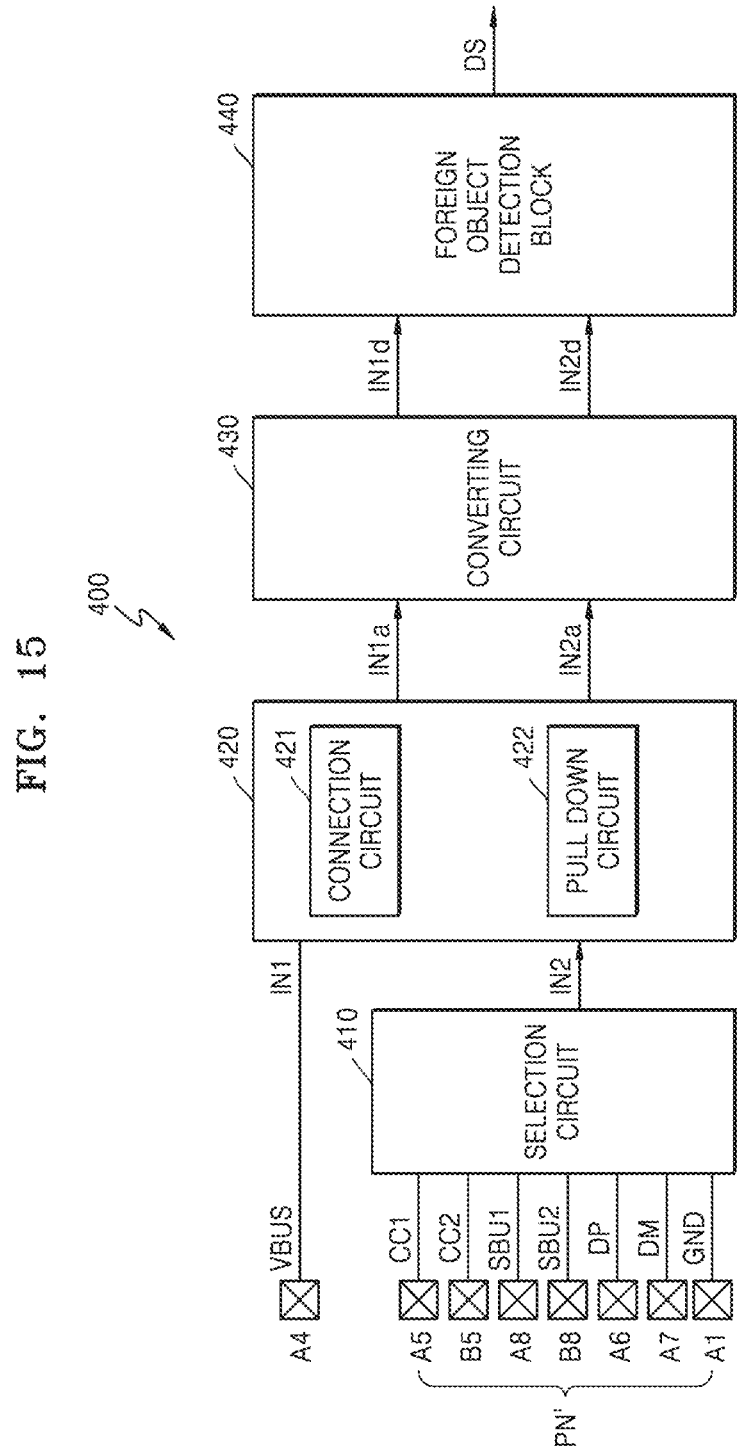
FIG. 15 is a block diagram illustrating a detection circuit in which the VBUS pin A4 is connected to the voltage signal generation circuit, according to some example embodiments.

FIG. 15 is a block diagram illustrating a detection circuit 400 according to some example embodiments.

Referring to FIG. 15, the detection circuit 400 may include a selection circuit 410, a voltage signal generation circuit 420, a converting circuit 430, and a foreign object detection block 440. The VBUS pin A4 may be connected to the voltage signal generation circuit 420. The voltage signal generation circuit 420 may receive the first input IN1 from the VBUS pin A4. The selection circuit 410 may select one of a plurality of pins PN'. The voltage signal generation circuit 420 may receive the second input IN2 from the pin selected by the selection circuit 410. For example, the plurality of pins PN' may be the CC1 pin A5, the CC2 pin B5, the SBU1 pin A8, the SBU2 pin B8, the DP pin A6, the DM pin A7, and the GND pin A1, but some example embodiments are not limited thereto. In some example embodiments, the foreign object detection block 440 may be implemented as a MCU or other hardware. The operations described herein as being performed by the foreign object detection block 440 may be performed by the MCU executing firmware instructions stored in a memory.

The voltage signal generation circuit 420 may receive the first and second inputs IN1 and IN2 and generate first and second voltage signals IN1a and IN2a corresponding to the received first and second inputs IN1 and IN2, respectively. Specifically, the voltage signal generation circuit 420 may include a connection circuit 421 and a pull-down circuit 422. A configuration of the voltage signal generation circuit 420 will be described in detail with reference to FIG. 16.

The converting circuit 430 may receive the first and second voltage signals IN1a and IN2a and perform ADC on the received first and second voltage signals IN1a and IN2a to generate the first and second digital signals IN1d and IN2d. The foreign object detection block 440 may calculate impedance between the VBUS pin A4 and the selected pin based on the first and second digital signals IN1d and IN2d. Also, the foreign object detection block 440 may generate the detection signal DS indicating presence or absence of a foreign object on a connector based on the calculated impedance. In some example embodiments, the detection circuit 400 may further include an alarm message generator, as illustrated in FIG. 14.

Figure 16:
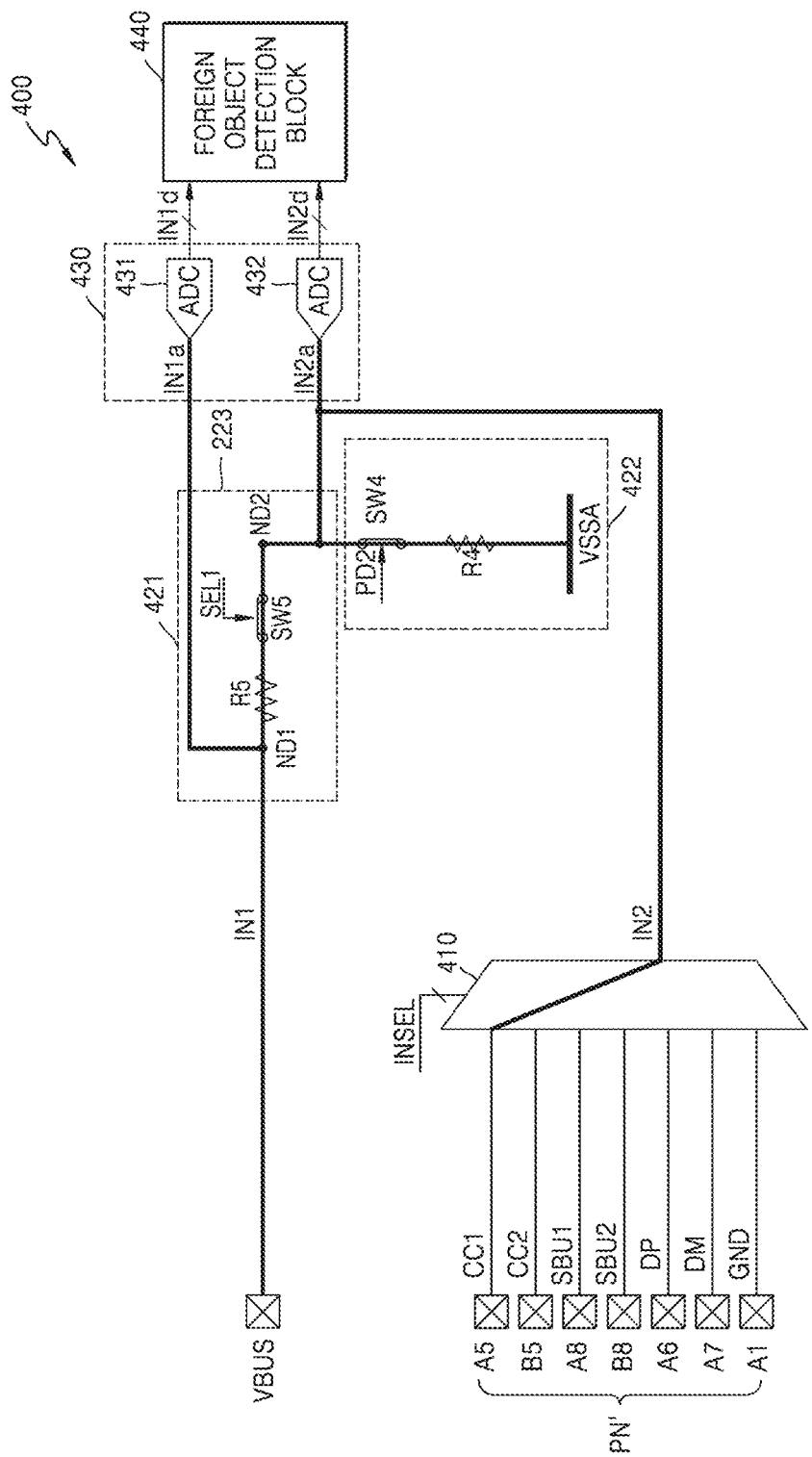
FIG. 16 is a circuit diagram showing the detection circuit of FIG. 15, according to some example embodiments.

FIG. 16 is a circuit diagram showing the detection circuit 400 of FIG. 15, according to some example embodiments.

Referring to FIG. 16, the detection circuit 400 may be electrically connected to the VBUS pin A4 and the plurality of pins PN'. In one example, the plurality of pins PN' may be the CC1 pin A5, the CC2 pin B5, the SBU1 pin A8, the SBU2 pin B8, the DP pin A6, the DM pin A7, and the GND pin A1. In another example, the plurality of pins PN' may be the CC1 pin A5, the CC2 pin B5, the SBU1 pin A8, the SBU2 pin B8, the DP pin A6, the DM pin A7, the VBUS pin A9 and the GND pin A1. However, types and number of the pins PN' connected to the detection circuit 400 may be variously changed according to some example embodiments. Further, in some example embodiments, the detection circuit 400 may be fixedly connected to a pin other than the VBUS pin A4.

The selection circuit 410 may be implemented as a single selector. The selector may select one of the plurality of pins PN' according to the input selection signal INSEL and output the second input IN2 from the selected pin. In some example embodiments, the selector may be implemented as a multiplexer. In some example embodiments, the input selection signal INSEL may be a 3-bit digital signal. Thus, the detection circuit 400 may select first and second pins of the plurality of pins, wherein the first pin may be a fixed pin, for example, the VBUS pin A4, and the second pin may be a variable pin.

The connection circuit 421 may include the fifth resistor R5 and the first connection selection switch SW5. The fifth resistor R5 and the first connection selection switch SW5 may be disposed between the first and second nodes ND1 and ND2 and may be connected in series with each other. The first connection selection switch SW5 may be turned on/off according to the first connection selection signal SEL1. The pull-down circuit 422 may include the fourth resistor R4 and the second pull down selection switch SW4 that are connected to the ground voltage terminal VSSA. The second pull down selection switch SW4 may connect the fourth resistor R4 to the second node ND2 according to the second pull-down select signal PD2.

The converting circuit 430 may include first and second ADCs 431 and 432. The first ADC 431 may receive a first voltage signal IN1a of the first node ND1 and perform ADC on the received first voltage signal IN1a to generate a first digital signal IN1d. The second ADC 432 may receive a second voltage signal IN2a of the second node ND2 and perform ADC on the received second voltage signal IN2a to generate a second digital signal IN2d.

Figure 17:
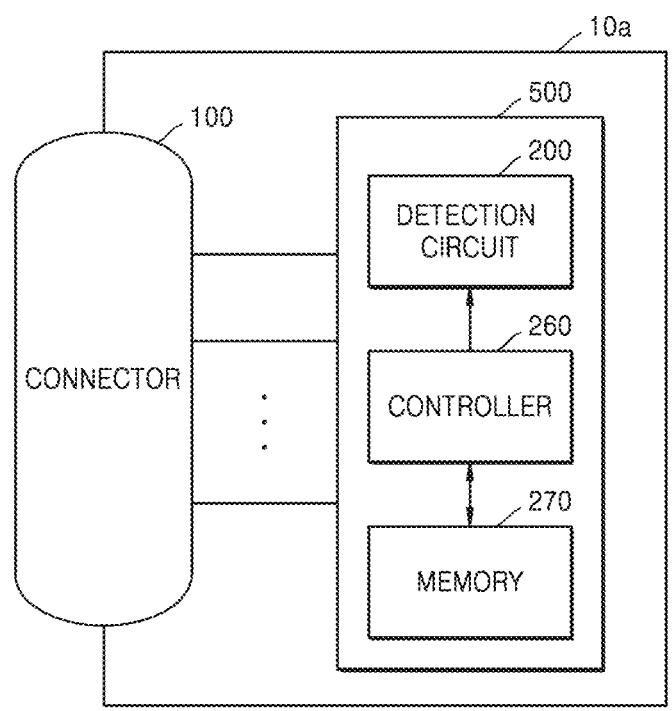
FIG. 17 is a block diagram illustrating an electronic device including a PDIC, according to some example embodiments.

FIG. 17 is a block diagram illustrating an electronic device 10a including a PDIC, according to some example embodiments.

Referring to FIG. 17, the electronic device 10a may include the connector 100 and a PDIC 500. The PDIC 500 may include the detection circuit 200, a controller 260, and a memory 270. The connector 100 and the detection circuit 200 may correspond to the connector 100 and the detection circuit 200 of FIG. 1, and the above description with reference to FIGS. 1 to 16 may also be applied to FIG. 17.

In some example embodiments, the controller 260 may generate the first and second input selection signals INSEL1 and INSEL2, the first and second source select signals SRC1 and SRC2, the first and second sync selection signals SNK1 and SNK2, the first and second pull-up selection signals PU1 and PU2, and the first and second pull-down selection signals PD1 and PD2, and the first and second connection selection signals SEL1 and SEL2. In some example embodiments, the foreign object detection block 240 may be implemented as part of the controller 260. In some example embodiments, the memory 270 may store firmware for controlling an operation of the foreign object detection block 240. In some example embodiments, the memory 270 may store firmware to generate a foreign object alarm message when a foreign object is present in the connector 100 or to limit voltage or current provided to a VBUS pin of a plurality of pins on the connector 100. In some example embodiments, the controller 260 and the memory 270 may be implemented as MCUs.

Figure 18:
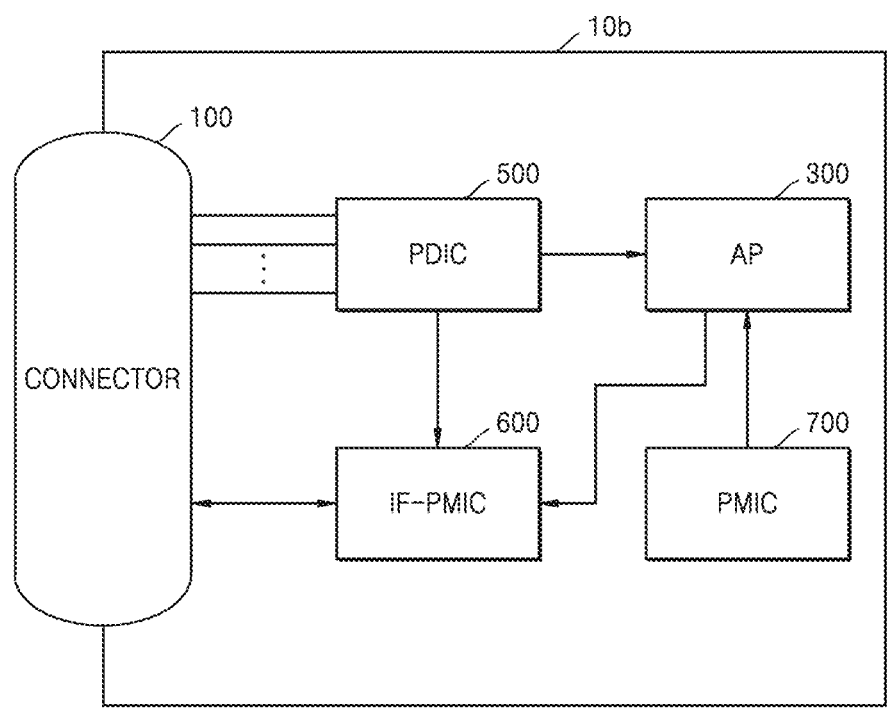
FIG. 18 is a block diagram illustrating an electronic device including a PDIC, an AP, an IF-PMIC and a PMIC, according to some example embodiments.

FIG. 18 is a block diagram illustrating an electronic device 10b including a PDIC, an AP, an IF-PMIC and a PMIC, according to some example embodiments.

Referring to FIG. 18, the electronic device 10b may include the connector 100, the PDIC 500, the AP 300, an IF-PMIC 600, and a PMIC 700. The connector 100 and the PDIC 500 may correspond to the connector 100 and the PDIC 500 of FIG. 17, respectively, and the above description with reference to FIGS. 1 to 17 may also be applied to FIG. 18. In some example embodiments, the PDIC 500 or the AP 300 may provide a control signal to limit boosting of a VBUS pin to the IF-PMIC 600, and the IF-PMIC 600 may control voltage or current supplied to the VBUS pin in response to the control signal.

Figure 19:
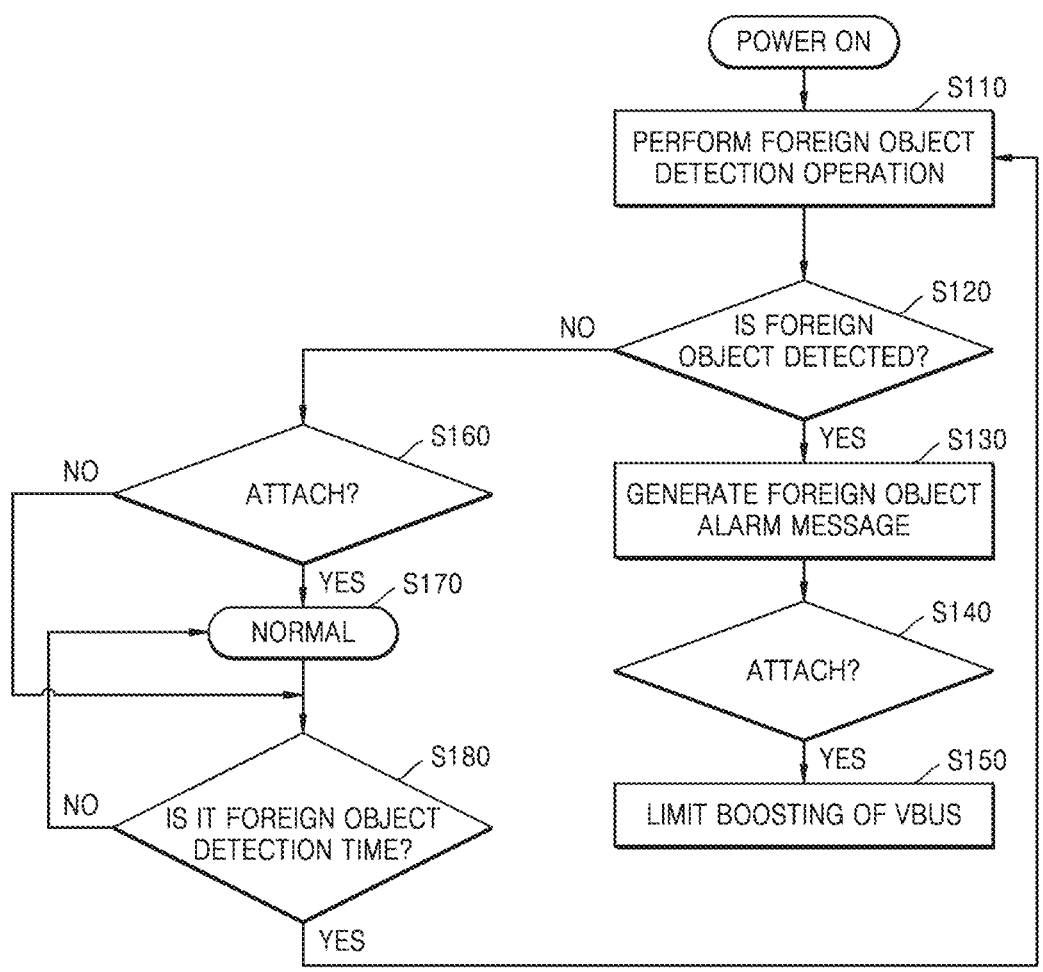
FIG. 19 is a flowchart showing a foreign object detection method of an electronic device according to some example embodiments.

FIG. 19 is a flowchart showing a foreign object detection method of an electronic device according to some example embodiments.

Referring to FIG. 19, the foreign object detection method of the electronic device according to some example embodiments is a method of detecting a case where some of a plurality of pins on a connector are opened or short-circuited by a foreign object on the connector of the electronic device, and for example, may include operations time serially performed by the electronic device 10 of FIG. 1 or the electronic device 10a of FIG. 17. The above description with reference to FIGS. 1 to 18 may also be applied to FIG. 19, and a redundant description will be omitted.

In operation S110, a foreign object detection operation is performed. In some example embodiments, the foreign object detection operation may refer to an operation of selecting first and second pins of a plurality of pins on a connector and measuring a pin-to-pin impedance between the selected first and second pins. In some example embodiments, the foreign object detection operation may further include an operation of determining whether a foreign object is present based on the measured pin-to-pin impedance. For example, the detection circuit 200 may perform the foreign object detection operation. The foreign object detection operation will be described in more detail with reference to FIG. 20.

In operation S120, it is determined whether the foreign object is detected on the connector. For example, it may be determined whether the foreign object is detected based on the detection signal DS output from the foreign object detection block 240. As a result of the determination, if the foreign object is detected on the connector, operation S130 is performed; otherwise operation S160 is performed.

In operation S130, a foreign object alarm message is generated. For example, the foreign object alarm message may be implemented as a visual signal, an audible signal or vibration that may be recognized by a user, and may be provided to the user through a display, a speaker, or the like of the electronic device 10. In some example embodiments, the foreign object detection block 240 or the AP 300 may generate the foreign object alarm message.

In operation S140, it is determined whether the electronic device is attached to an external electronic device via a cable. For example, the detection circuit 200 or the PDIC 500 may determine whether the electronic device is attached based on a voltage level applied to the plurality of pins. As a result of the determination, if the electronic device is attached, operation S150 is performed.

In operation S150, boosting of a VBUS voltage supplied to a VBUS pin is restricted. In some example embodiments, a voltage level or a current level applied to the VBUS pin may be reduced. In some example embodiments, supply of the VBUS voltage applied to the VBUS pin may be blocked. For example, the detection circuit 200 or the PDIC 500, or the AP 300, may provide a control signal to limit the boosting of the VBUS voltage to the IF-PMIC 600, and the IF-PMIC 600 may control voltage or current provided to the VBUS pin in response to the control signal.

In operation S160, it is determined whether the electronic device is attached to the external electronic device via the cable. As a result of the determination, if the electronic device is attached, operation S170 is performed; otherwise, operation S180 is performed. In operation S170, the electronic device 10 may normally communicate with or transmit/receive power to/from the external electronic device via the cable. In operation S180, a foreign object detection time is determined. For example, the detection circuit 200 or the PDIC 500 may perform the foreign object detection operation according to a determined foreign object detection period. As a result of the determination, if it is the foreign object detection time, operation S110 is performed, and if not, operation S170 is performed.

Figure 20:
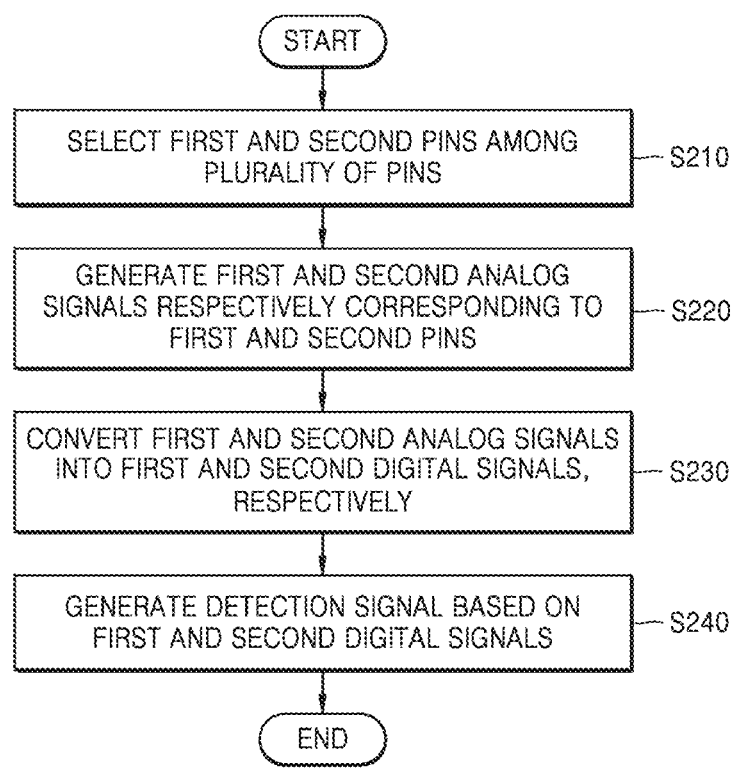
FIG. 20 is a flowchart illustrating a method of measuring impedance according to some example embodiments.

FIG. 20 is a flowchart illustrating a method of measuring impedance according to some example embodiments.

Referring to FIG. 20, the method of measuring the impedance according to some example embodiments may be a method of measuring the impedance between a plurality of pins on a connector of an electronic device, and for example, may correspond to an example of operation S110 of FIG. 19. Also, the method of measuring the impedance according to some example embodiments may be time serially performed by the detection circuit 200 of FIG. 1, and above description with reference to FIGS. 1 to 19 may also be applied to FIG. 20.

In operation S210, first and second pins of a plurality of pins are selected. In some example embodiments, the selection circuit 210 may select the first and second pins of the plurality of pins. However, in some example embodiments, the first pin may be determined and fixed, and the selection circuit 410 may select one of the plurality of pins as the second pin. Further, in some example embodiments, the selection circuit 410 may select three or more of the plurality of pins.

In operation S220, first and second analog signals corresponding respectively to the first and second pins are generated. For example, the first analog signal may correspond to a first voltage signal of a first node connected to the first pin, and the second analog signal may correspond to a second voltage signal of a second node connected to the second pin. In operation S230, the first and second analog signals are converted into first and second digital signals, respectively. In operation S240, based on the first and second digital signals, a detection signal indicating presence or absence of a foreign object on a connector is generated.

While some example embodiments have been particularly shown and described, it will be understood that various changes in form and details may be made therein without departing from the spirit and scope of the following claims.

What is claimed is:

1. An electronic device comprising:
   a connector including a first pin and a plurality of pins; and
   a detection circuit including:
      a selection circuit configured to select a second pin among the plurality of pins,
      a connection circuit including a first resistor connectable between a first node connected to the first pin and a second node connected to the second pin, and
      a pull-down circuit configured to provide a ground voltage to the second node,
   the detection circuit configured to:
      measure an impedance between the first pin and the second pin by controlling a connection of the connection circuit and the pull-down circuit, and
      generate a detection signal indicating a presence or an absence of a foreign object on the connector based on the measured impedance.

2. The electronic device of claim 1, wherein the connector is connectable to a USB type-C cable and is at least one of a USB t e-C receptacle or a USB type-C plug.

3. The electronic device of claim 1, further comprising:
   an application processor configured to:
      receive the detection signal from the detection circuit, and
      perform a function based on the received detection signal, the function including at least one of generating a foreign object alarm message based on the received detection signal, or limiting voltage or current supplied to the first pin.

4. The electronic device of claim 1, wherein the detection circuit is further configured to perform a function if the detection signal indicates that a foreign object is present on the connector, the function including at least one of generating a foreign object alarm message, or limiting voltage or current provided to the first pin.

5. The electronic device of claim 1, wherein the selection circuit comprises: a selector configured to select the second pin among the plurality of pins.

6. The electronic device of claim 1, wherein the detection circuit further includes: an analog-to-digital converter configured to generate first and second digital signals by performing analog-to-digital conversion on a first voltage signal corresponding to a state of the first pin and a second voltage signal corresponding to a state of the second pin, and
   wherein the detection circuit is further configured to measure the impedance based on the first and second digital signals.

7. The electronic device of claim 1, wherein the pull-down circuit is connected to a ground voltage terminal in response to a pull-down selection signal.

8. The electronic device of claim 7, wherein the pull-down circuit comprises:
   a second resistor connected to the ground voltage terminal; and
   a pull-down switch between the second node and the second resistor, wherein the pull-down switch is configured to switch according to the pull-down selection signal.

9. The electronic device of claim 1, wherein the first pin corresponds to a VBUS pin.

10. The electronic device of claim 1, further comprising: a power delivery integrated circuit (PDIC), wherein the PDIC includes:
    the detection circuit; and
    a controller configured to control the connection of the connection circuit and the pull-down circuit.

11. The electronic device of claim 10, wherein the PDIC further includes a memory configured to store at least one of firmware for controlling a foreign object detecting operation of the controller, firmware for generating a foreign object alarm message when the foreign object is present in the connector, and firmware for limiting voltage or current provided to the first pin.

12. A method of detecting a foreign object on a connector of an electronic device, the connector including a first pin and a plurality of pins, the method comprising:
    selecting a second pin among the plurality of pins included in the connector;
    measuring an impedance between the first pin and the second pin by controlling a connection of a connection circuit and a pull-down circuit; and
    generating a detection signal indicating a presence or an absence of a foreign object on the connector based on the measured impedance,
       wherein the connection circuit includes a resistor connectable between a first node connected to the first pin and a second node connected to the second pin, and the pull-down circuit is configured to provide a ground voltage to the second node.

13. The method of claim 12, wherein the measuring comprises:
generating first and second voltage signals corresponding to the first and second pins, respectively;
converting the first and second voltage signals into first and second digital signals, respectively; and
measuring the impedance based on the first and second digital signals.

14. The method of claim 12, wherein the first pin corresponds to a VBUS pin, and
wherein the method further comprises: limiting voltage or current of the VBUS pin according to the detection signal.

15. The method of claim 12, further comprising:
determining whether a cable is connected to the electronic device through the connector; and
repeating the selecting, the measuring, and the generating after a determined foreign object detection period.

16. The method of claim 12, wherein the connector is connectable to a USB type-C cable and is at least one of a USB type-C receptacle or a USB type-C plug.

17. A method of providing a foreign object alarm message of an electronic device, the electronic device including a connector including a first pin and a plurality of pins, the method comprising:
selecting a second pin among the plurality of pins included in the connector;
measuring an impedance between the first pin and the second pin by controlling a connection of a connection circuit and a pull-down circuit;
generating a detection signal indicating a presence or an absence of a foreign object on the connector based on the measured impedance; and
providing the foreign object alarm message according to the generated detection signal, by an alarm message generator of the electronic device,
wherein the connection circuit includes a resistor connectable between a first node connected to the first pin and a second node connected to the second pin, and
the pull-down circuit is configured to provide a ground voltage to the second node.

18. The method of claim 17, wherein the measuring comprises:
generating first and second voltage signals corresponding to the first and second pins, respectively;
converting the first and second voltage signals into first and second digital signals, respectively; and
measuring the impedance based on the first and second digital signals.

19. The method of claim 17, wherein the first pin corresponds to a VBUS pin, and
wherein the method further comprises: limiting voltage or current of the VBUS pin according to the detection signal.

20. The method of claim 17, further comprising:
determining whether a cable is connected to the electronic device through the connector; and
repeating the selecting, the measuring, and the generating after a determined foreign object detection period.

* * * * *